US012310010B2

(12) United States Patent
Liu et al.

(10) Patent No.: US 12,310,010 B2
(45) Date of Patent: May 20, 2025

(54) TRANSISTORS WITH RAISED EXTENSION REGIONS AND SEMICONDUCTOR FINS

(71) Applicant: MICRON TECHNOLOGY, INC., Boise, ID (US)

(72) Inventors: Haitao Liu, Boise, ID (US); Michael Violette, Boise, ID (US); Mark A. Helm, Santa Cruz, CA (US); Guangyu Huang, El Dorado Hills, CA (US); Vladimir Mikhalev, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 529 days.

(21) Appl. No.: 17/110,439

(22) Filed: Dec. 3, 2020

(65) Prior Publication Data

US 2022/0181341 A1 Jun. 9, 2022

(51) Int. Cl.
*H10B 41/27* (2023.01)
*G11C 16/04* (2006.01)
*H10B 43/27* (2023.01)
*H10B 43/40* (2023.01)
*H10D 30/62* (2025.01)
*H10D 84/83* (2025.01)

(52) U.S. Cl.
CPC ............ *H10B 41/27* (2023.02); *G11C 16/04* (2013.01); *H10B 43/27* (2023.02); *H10D 30/62* (2025.01); *H10D 30/6219* (2025.01); *H10D 84/834* (2025.01)

(58) Field of Classification Search
CPC .......... H01L 27/0886; H01L 29/41791; H01L 29/785; H10B 41/35; H10B 41/41; H10B 43/35
See application file for complete search history.

(56) References Cited

U.S. PATENT DOCUMENTS 5,561,623 A * 10/1996 Ema .................... H01L 23/4951
365/72
9,722,053 B1 * 8/2017 Sung ................. H01L 29/66818
(Continued)

OTHER PUBLICATIONS

Yi-Ting Wu, et al., "Simulation-Based Study of Hybrid Fin/Planar LDMOS Design for FinFET-Based System-on-Chip Technology". IEEE-TED, Oct. 2017, pp. 4193-4199.
(Continued)

*Primary Examiner* — Vu A Vu
*Assistant Examiner* — Valerie N Newton
(74) *Attorney, Agent, or Firm* — Dicke, Billig & Czaja, PLLC

(57) ABSTRACT

Apparatus having a transistor connected between a voltage node and a load node, where the transistor includes a dielectric material overlying a semiconductor material including fins and having a first conductivity type, a conductor overlying the dielectric material, first and second extension region bases formed in the semiconductor material and having a second conductivity type, first and second extension region risers formed overlying respective first and second extension region bases and having the second conductivity type, and first and second source/drain regions formed in respective first and second extension region risers and having the second conductivity type at greater conductivity levels than their respective extension region risers, as well as method of forming similar transistors.

34 Claims, 23 Drawing Sheets

(56) References Cited

U.S. PATENT DOCUMENTS

| | | | |
|---|---|---|---|
| 11,302,395 B2* | 4/2022 | Liu | H10B 43/35 |
| 2004/0257875 A1* | 12/2004 | Yaoi | H01L 29/792 |
| | | | 257/E21.21 |
| 2011/0128788 A1* | 6/2011 | Honda | G11C 16/0408 |
| | | | 365/185.11 |
| 2013/0289964 A1* | 10/2013 | Lu | G06F 30/367 |
| | | | 703/13 |
| 2016/0351709 A1* | 12/2016 | Nishikawa | H01L 27/0922 |
| 2018/0090391 A1* | 3/2018 | Park | H01L 21/823892 |
| 2018/0358293 A1* | 12/2018 | Hong | H01L 21/76808 |
| 2021/0083065 A1* | 3/2021 | Chang | H01L 29/42316 |
| 2021/0398948 A1* | 12/2021 | Kim | H01L 25/50 |

OTHER PUBLICATIONS

Jhen-Yu Tsai, etc., "A Novel Hybrid Poly-Si Nanowire LDMOS With Extended Drift", IEEE-EDL, Mar. 2014, pp. 366-368.
Haitao Liu; "Apparatus Having Transistors with Raised Extension Regions and Methods of Forming Such Transistors"; U.S. Appl. No. 16/451,143, filed Jun. 25, 2019; Total pp. 52.

\* cited by examiner

TRANSISTORS WITH RAISED EXTENSION REGIONS AND SEMICONDUCTOR FINS

TECHNICAL FIELD

The present disclosure relates generally to integrated circuits and, in particular, in one or more embodiments, the present disclosure relates to transistors with raised extension regions and semiconductor fins, as well as apparatus containing such transistors and methods of forming such transistors.

BACKGROUND

Integrated circuit devices traverse a broad range of electronic devices. One particular type include memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as column bit line. Variations using more than one select gate between a string of memory cells and the source, and/or between the string of memory cells and the data line, are known.

In a memory device, access of memory cells (e.g., programming memory cells) often utilizes high voltage levels delivered to the control gates of those memory cells, which might exceed 20V. Gating such voltage levels often relies on transistors, such as field-effect transistors (FETs), having high breakdown voltages. One technique for creating transistors with high breakdown voltages uses a lightly-doped region between a source/drain region and the control gate of the transistor. This region is sometimes referred to as an extension region. Such transistors often require relatively high levels of surface area of a substrate on which an integrated circuit device is fabricated.

DETAILED DESCRIPTION

Figure 1:
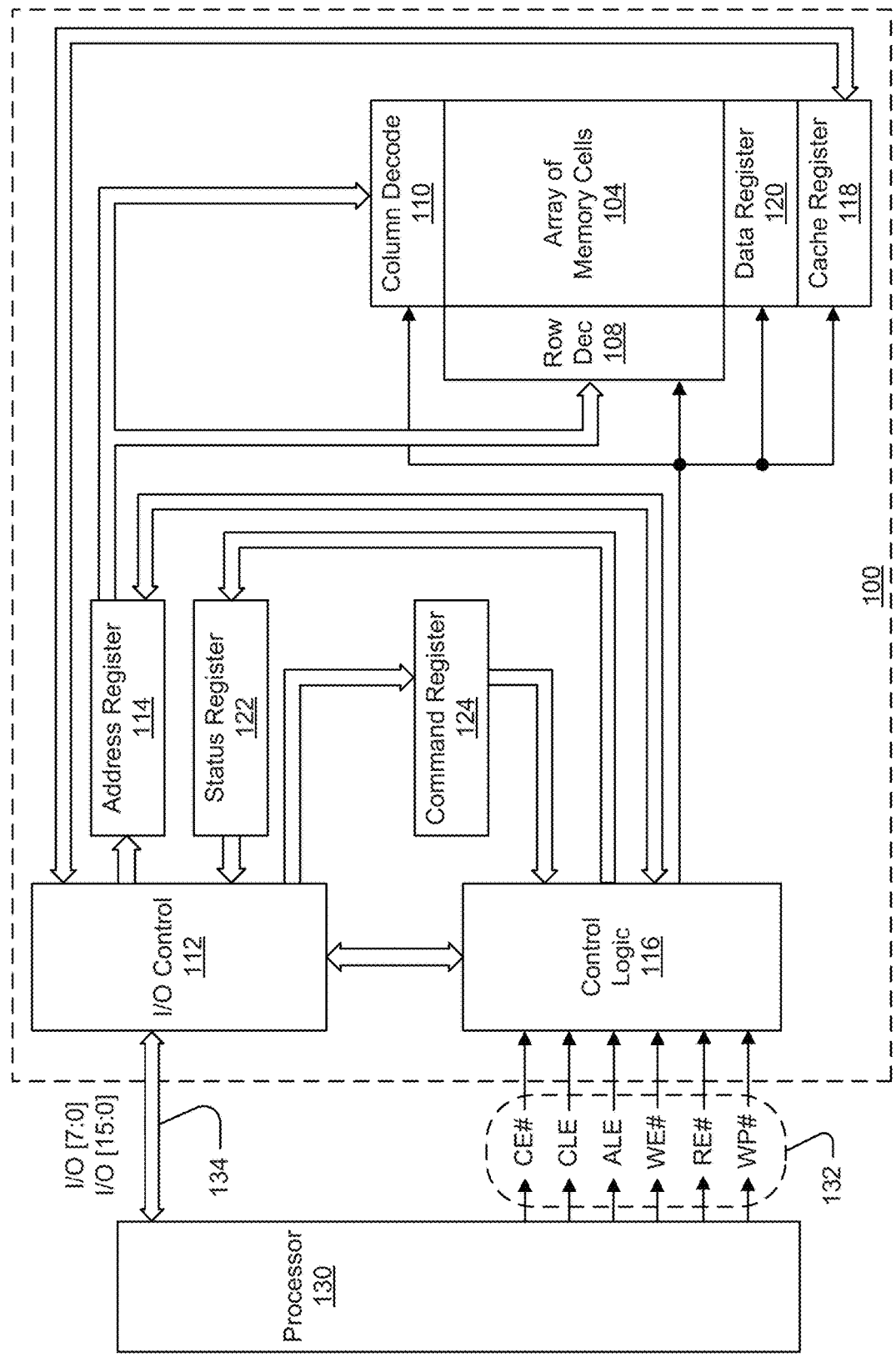
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and may generate status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
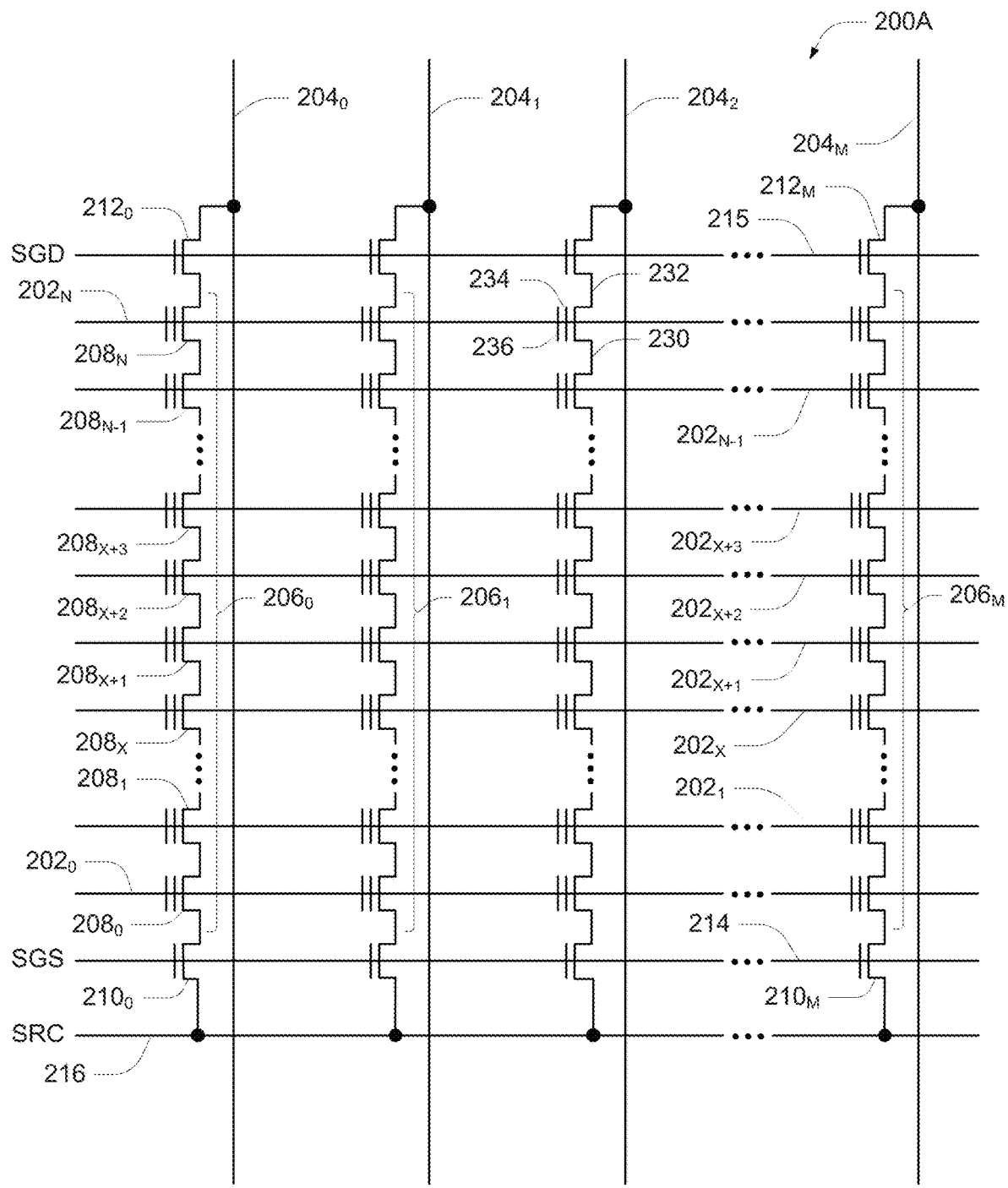
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines (e.g., word lines) $202_0$ to $202_N$, and data lines (e.g., bit lines) $204_0$ to $204_M$. The access lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to an access line 202) and columns (each corresponding to a data line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the data line 204 for the corresponding NAND string 206. For example, the drain of select gate $212_0$ might be connected to the data line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding data line 204. A control gate of each select gate 212 might be connected to select line 215.

The memory array in FIG. 2A might be a quasi-two-dimensional memory array and might have a generally planar structure, e.g., where the common source 216, NAND strings 206 and data lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the data lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. For example, memory cells 208 commonly connected to access line $202_N$ and selectively connected to even data lines 204 (e.g., data lines $204_0$, $204_2$, $204_4$, etc.) might be one physical page of memory cells 208 (e.g., even memory cells) while memory cells 208 commonly connected to access line $202_N$ and selectively connected to odd data lines 204 (e.g., data lines $204_1$, $204_3$, $204_5$, etc.) might be another physical page of memory cells 208 (e.g., odd memory cells). Although data lines $204_3$-$204_5$ are not explicitly depicted in FIG. 2A, it is apparent from the figure that the data lines 204 of the array of memory cells 200A might be numbered consecutively from data line $204_0$ to data line $204_M$. Other groupings of memory cells 208 commonly connected to a given access line 202 might also define a physical page of memory cells 208. For certain memory devices, all memory cells commonly connected to a given access line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to access lines $202_0$-$202_N$ (e.g., all NAND strings 206 sharing common access lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
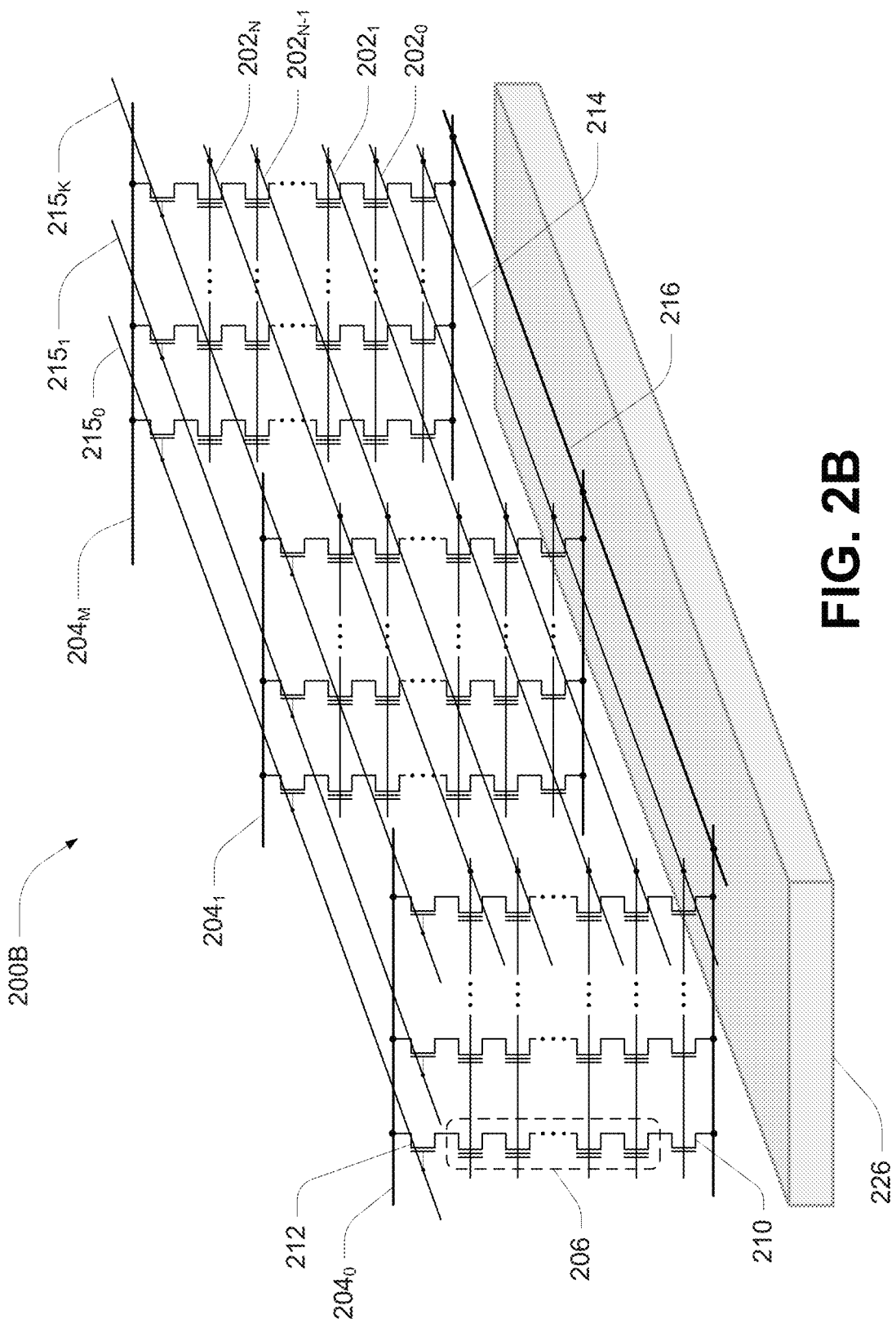

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206. The NAND strings 206 might be each selectively connected to a data line $204_0$-$204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same data line 204. Subsets of NAND strings 206 can be connected to their respective data lines 204 by biasing the select lines $215_0$-$215_K$ to selectively activate particular select transistors 212 each between a NAND string 206 and a data line 204. The select transistors 210 can be activated by biasing the select line 214. Each access line 202 might be connected to multiple rows of memory cells of the memory array 200B. Rows of memory cells that are commonly connected to each other by a particular access line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
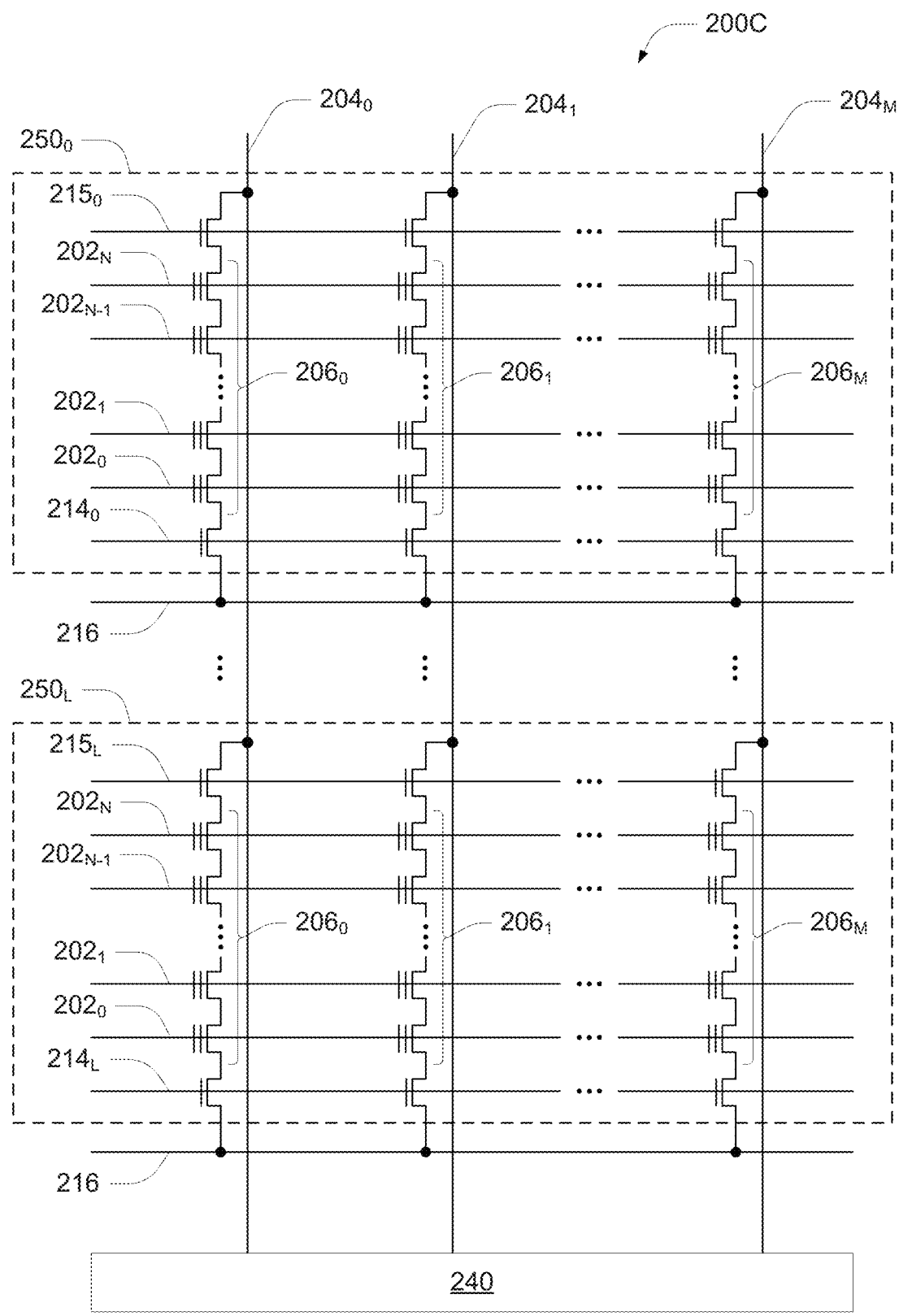

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250, e.g., blocks of memory cells $250_0$-$250_L$. Blocks of memory cells 250 may be groupings of memory cells 208 that may be erased together in a single erase operation, sometimes referred to as erase blocks. Each block of memory cells 250 might include those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 may have no direct connection to access lines 202 and select lines 214 and 215, respectively, of any other block of memory cells of the blocks of memory cells $250_0$-$250_L$.

The data lines $204_0$-$204_M$ may be connected (e.g., selectively connected) to a buffer portion 240, which might be a portion of a data buffer of the memory. The buffer portion 240 might correspond to a memory plane (e.g., the set of blocks of memory cells $250_0$-$250_L$). The buffer portion 240 might include sense circuits (not shown in FIG. 2C) for sensing data values indicated on respective data lines 204.

While the blocks of memory cells 250 of FIG. 2C depict only one select line 215 per block of memory cells 250, the blocks of memory cells 250 might include those NAND strings 206 commonly associated with more than one select line 215. For example, select line $215_0$ of block of memory cells $250_0$ might correspond to the select line $215_0$ of the memory array 200B of FIG. 2B, and the block of memory cells of the memory array 200C of FIG. 2C might further include those NAND strings 206 associated with select lines $215_1$-$215_K$ of FIG. 2B. In such blocks of memory cells 250 having NAND strings 206 associated with multiple select lines 215, those NAND strings 206 commonly associated with a single select line 215 might be referred to as a sub-block of memory cells. Each such sub-block of memory cells might be selectively connected to the buffer portion 240 responsive to its respective select line 215.

Figure 3A:
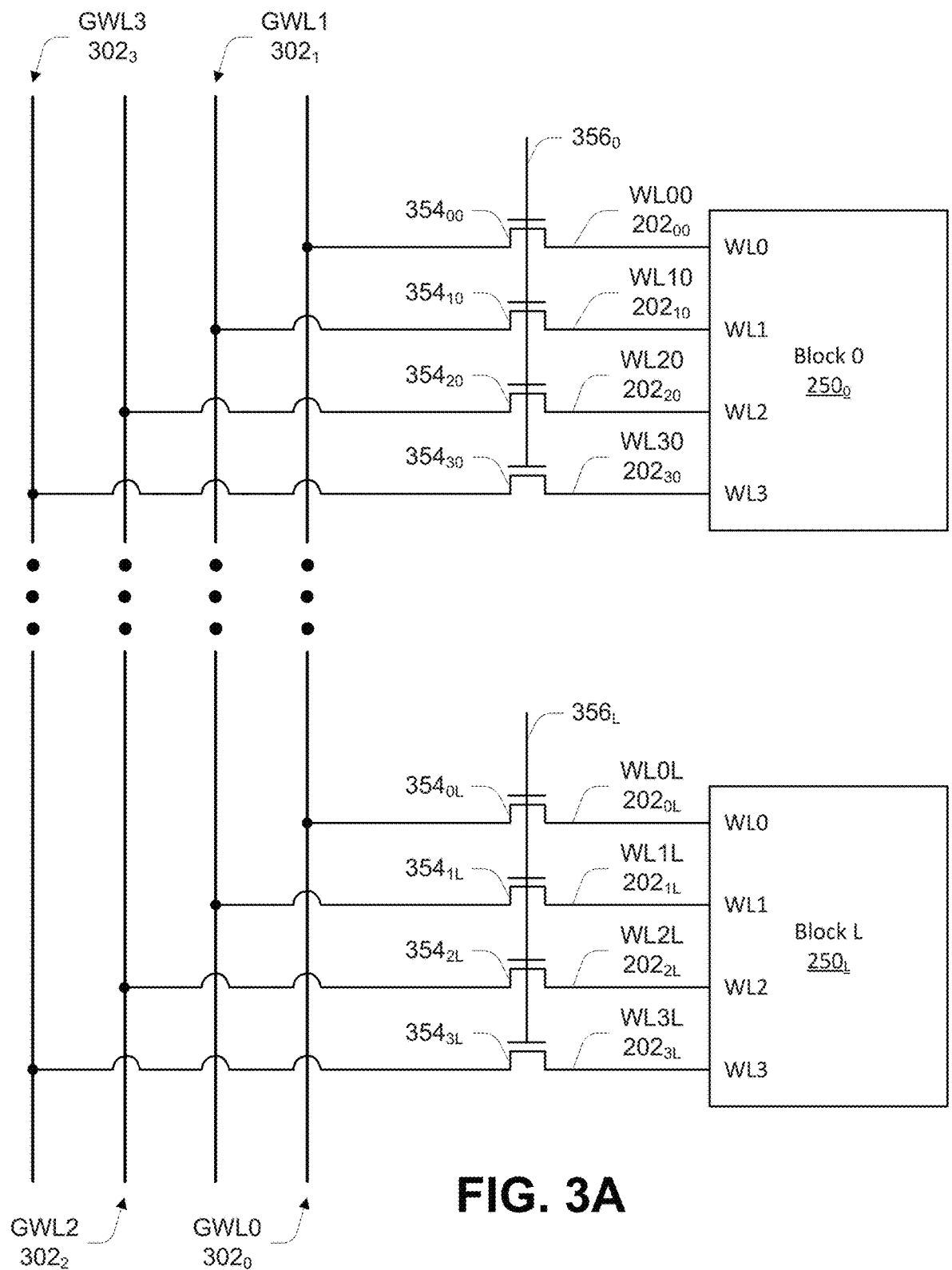
FIG. 3A is a schematic of a portion of an array of memory cells and string drivers as could be used in a memory device of the type described with reference to FIG. 1.

FIG. 3A is a schematic of a portion of an array of memory cells and string drivers as could be used in a memory device of the type described with reference to FIG. 1 and depicting a many-to-one relationship between local access lines (e.g., local word lines) 202 and global access lines (e.g., global word lines) 302.

As depicted in FIG. 3A, a plurality of memory blocks 250 may have their local access lines 202 commonly selectively connected to a plurality of global access lines 302. Although FIG. 3A depicts only memory blocks $250_0$ and $250_L$ (Block 0 and Block L), additional memory blocks 250 may have their access lines 202 commonly connected to global access lines 302 in a like manner. Similarly, although FIG. 3A depicts only four access lines 202, memory blocks 250 may include fewer or more access lines 202.

To facilitate memory access operations to specific memory blocks 250 commonly coupled to a given set of global access lines 302, each memory block 250 may have a corresponding set of block select transistors 354 in a one-to-one relationship with their access lines 202. Control gates of the set of block select transistors 354 for a given memory block 250 may have their control gates commonly coupled to a corresponding block select line 356. For example, for memory block $250_0$, access line $202_{10}$ may be selectively connected to global access line $302_0$ through block select transistor $354_{00}$, access line $202_{10}$ may be selectively connected to global access line $302_1$ through block select transistor $354_{10}$, access line $202_{20}$ may be selectively connected to global access line $302_2$ through block select transistor $354_{20}$, and access line $202_{30}$ may be selectively connected to global access line $302_3$ through block select transistor $354_{30}$, while block select transistors $354_{00}$-$354_{30}$ are responsive to a control signal received on block select line $356_0$. The block select transistors 354 for a block of memory cells 250 might collectively be referred to as a string driver, or simply driver circuitry.

Figure 3B:
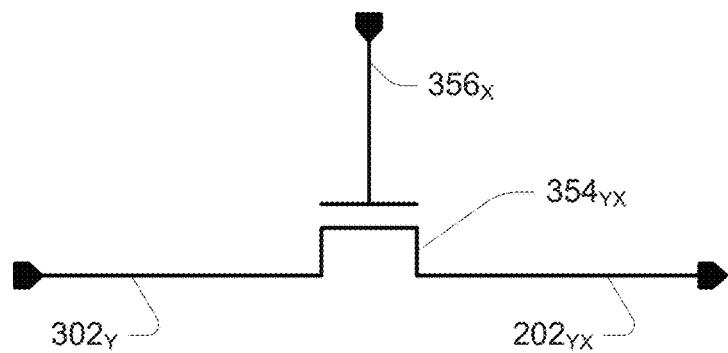
FIG. 3B is a schematic of a portion of one example of a string driver as could be used in a memory of the type described with reference to FIG. 1.

FIG. 3B is a schematic of a portion of one example of a string driver as could be used in a memory of the type described with reference to FIG. 1. The portion of the string driver of FIG. 3B depicts one transistor, e.g., block select transistor $354_{YX}$, responsive to a control signal node, e.g., block select line $356_X$, and connected between a voltage node, e.g., a global access line $302_Y$, configured to supply a voltage level, and a load node, e.g., local access line $202_{YX}$, configured to receive that voltage level. For example, the block select transistor $354_{YX}$ might represent the block select transistor $354_{10}$ having a control gate connected to the block select line $356_0$, and connected between the global access line $302_1$ and the local access line $202_{10}$ of the block of memory cells $250_0$. The block select transistor $354_{YX}$ might be a high-voltage n-type FET or nFET.

Figure 3C:
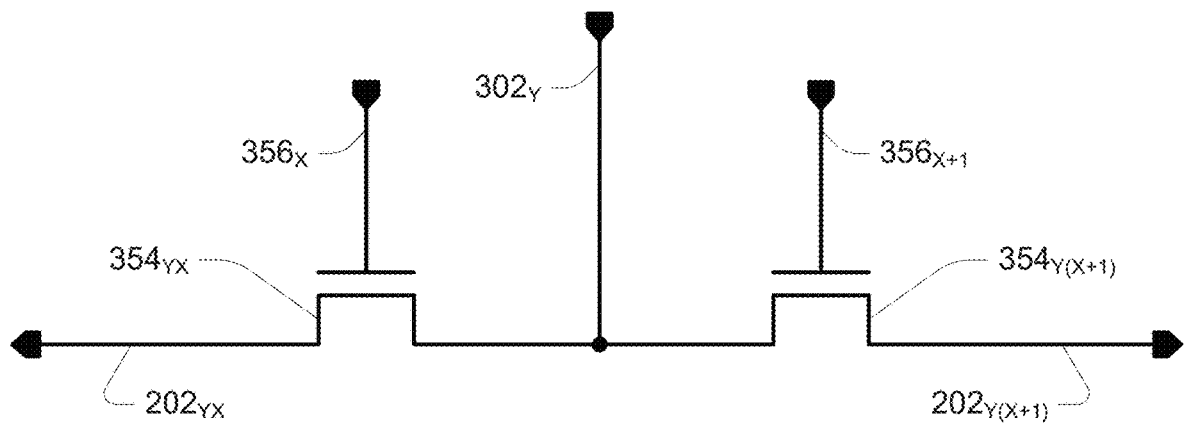
FIG. 3C is a schematic of a portion of another example of a string driver as could be used in a memory of the type described with reference to FIG. 1.

FIG. 3C is a schematic of a portion of another example of a string driver as could be used in a memory of the type described with reference to FIG. 1. The portion of the string driver of FIG. 3C depicts two transistors, e.g., block select transistor $354_{YX}$ and block select transistor $354_{Y(X+1)}$. Block select transistor $354_{YX}$ is responsive to a control signal node, e.g., block select line $356_X$, and connected between a voltage node, e.g., a global access line $302_Y$, configured to supply a voltage level, and a load node, e.g., local access line $202_{YX}$, configured to receive that voltage level. For example, the block select transistor $354_{YX}$ might represent the block select transistor $354_{10}$ having a control gate connected to the block select line $356_0$ and connected between the global access line $302_1$ and the local access line $202_{10}$ of the block of memory cells $250_0$.

Block select transistor $354_{Y(X+1)}$ is responsive to a control signal node, e.g., block select line $356_{X+1}$, and connected between a voltage node, e.g., the global access line $302_Y$, configured to supply a voltage level, and a load node, e.g., local access line $202_{Y(X+1)}$, configured to receive that voltage level. For example, the block select transistor $354_{Y(X+1)}$ might represent the block select transistor $354_{1L}$ having a control gate connected to the block select line $356_L$ and connected between the global access line $302_1$ and the local access line $202_{1L}$ of the block of memory cells $250_L$. The block select transistors $354_{YX}$ and $354_{Y(X+1)}$ might each be high-voltage n-type FETs or nFETs.

Figure 4A:
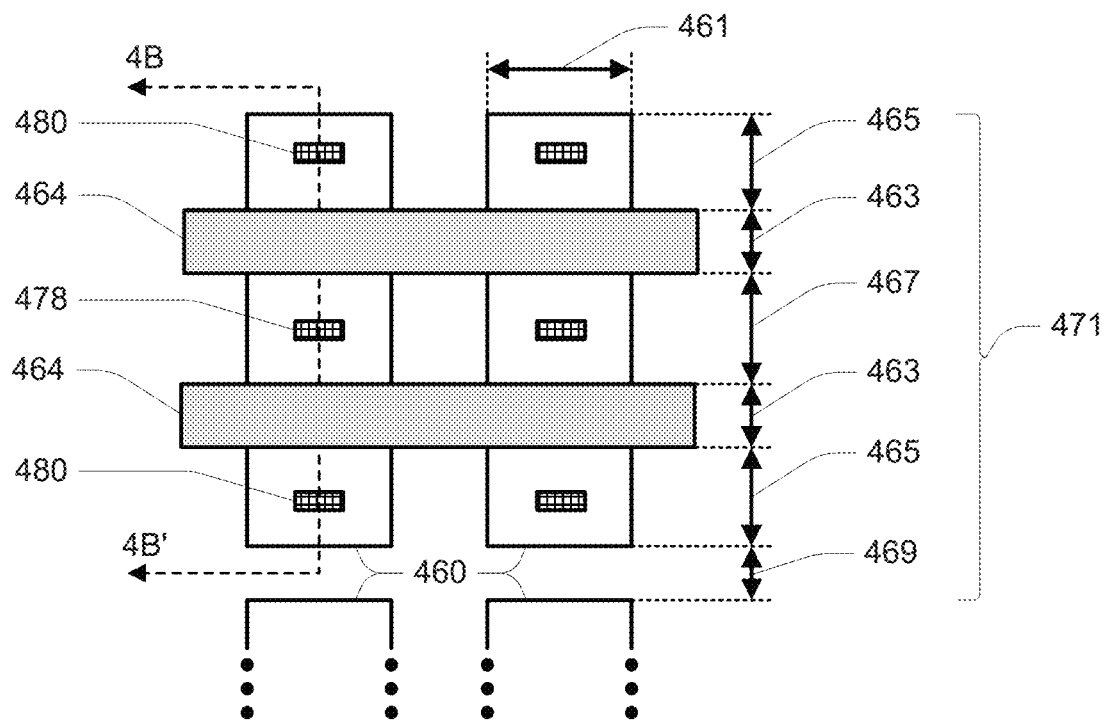
FIG. 4A is a plan view of transistors of the related art.

FIG. 4A is a plan view of transistors of the related art. The transistors of FIG. 4A might be represented by a schematic such as depicted in FIG. 3C. In FIG. 4A, the transistors are formed in an active area 460 of a semiconductor. Each transistor might be formed between a first contact 478, e.g., for connection to a voltage node, and a second contact 480, e.g., for connection to a load node. Such transistors might be responsive to a control signal received on a conductor 464, which might be connected to (and might form) a control gate of one or more transistors.

Each active area 460 might have a width 461. A distance 463 might represent a width of a conductor 464, a distance 465 might represent the distance between an edge (e.g., nearest edge) of a conductor 464 and an end (e.g., nearest end) of the active area 460, a distance 467 might represent a distance between adjacent edges of the conductors 464, and a distance 469 might represent a distance between adjacent ends of active areas 460. An active area 460 might have a length 471 equal to a sum of the distances 463, 465 and 467 between its ends.

Figure 4B:
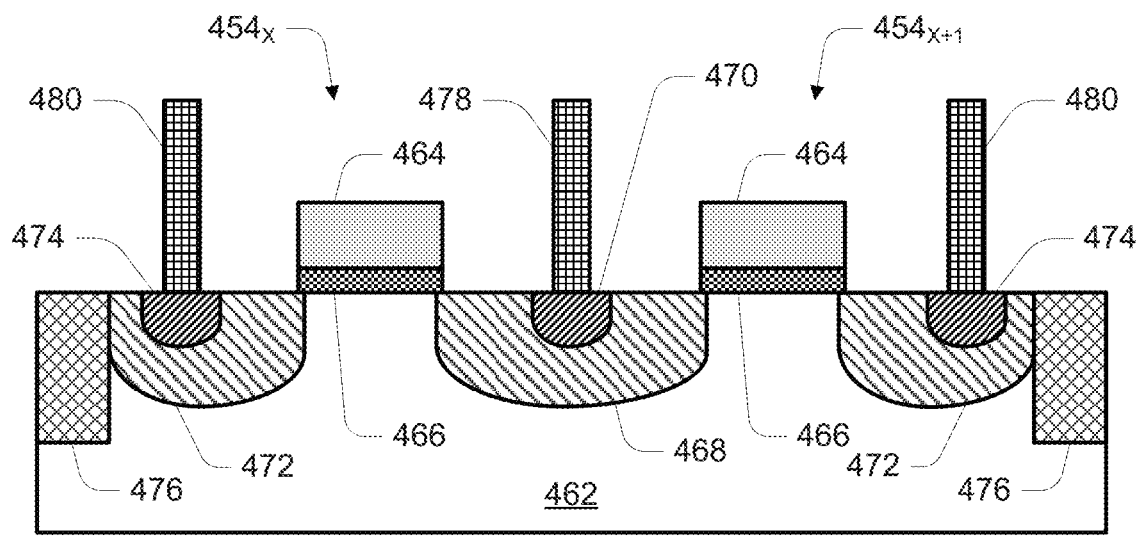
FIG. 4B is a cross-sectional view of transistors of FIG. 4A.

FIG. 4B is a cross-sectional view of transistors of FIG. 4A taken along line 4B-4B'. FIG. 4B depicts two transistors 454, e.g., $454_X$ and $454_{X+1}$, which might correspond to transistors $354_{YX}$ and $354_{Y(X+1)}$ of FIG. 3C. The transistors 454 are formed overlying (e.g., on) a semiconductor 462. The semiconductor 462 might contain monocrystalline silicon or other semiconductor material. The semiconductor 462 might have a conductivity type, e.g., a p-type conductivity. Isolation regions 476 might be formed in the semiconductor 462 to define the active areas 460 of FIG. 4A.

A gate stack of each transistor 454 of FIG. 4B might include a dielectric 466 formed overlying (e.g., on) the semiconductor 462, and a conductor 464 formed overlying (e.g., on) a corresponding gate dielectric 466. The dielectric 466 might generally be formed of one or more dielectric materials, while the conductor 464 might generally be formed of one or more conductive materials. The dielectric 466 might correspond to a gate dielectric of its corresponding transistor 454, while the conductor 464 might correspond to a control gate of that corresponding transistor 454.

A first extension region 468 might be formed in the semiconductor 462 between the gate stacks of the transistors 454. The first extension region 468 might have a conductivity type different than (e.g., opposite of) the conductivity type of the semiconductor 462. Continuing with the example, the first extension region 468 might have an n-type conductivity. The conductivity level of the first extension region 468 might be referred to as lightly doped, e.g., having an n– conductivity. To produce an n-type conductivity in a p-type substrate, a dopant species might include ions of arsenic (As), antimony (Sb), phosphorus (P) or another n-type impurity. Alternatively, to produce a p-type conductivity in an n-type substrate, a dopant species might include ions of boron (B) or another p-type impurity.

A first source/drain region (e.g., source) 470 might be formed in the first extension region 468. The first source/drain region 470 might have a conductivity type the same as the conductivity type of the first extension region 468, but at a higher conductivity level. For example, the first source/drain region 470 might have an n+ conductivity. The difference in conductivity levels might correspond to different levels of impurities, e.g., dopant species, implanted in the semiconductor 462. The level of impurities of the first source/drain region 470 might be an order of magnitude or more than the level of impurities of the first extension region 468. As one example, an n– conductivity might represent an impurity level of 1E16~1E19 ions/cm$^{-3}$ while an n+ conductivity might represent an impurity level of greater than or equal to 1E20 ions/cm$^{-3}$.

A first contact 478 might be formed to be connected to the first source/drain region 470. The first contact 478 might generally be formed of one or more conductive materials. The first contact 478 might be configured to receive a voltage level to provide to the first source/drain region 470. For example, the first contact 478 might be configured to connect to a global access line 302 of FIG. 3A.

A second extension region 472 might be formed in the semiconductor 462 adjacent each gate stack of the transistors 454. The second extension region 472 might have a conductivity type different than (e.g., opposite of) the conductivity type of the semiconductor 462. Continuing with the example, the second extension region 472 might have an n-type conductivity. The conductivity level of the second extension region 472 might be referred to as lightly doped, e.g., having an n− conductivity.

A second source/drain region (e.g., drain) 474 might be formed in each second extension region 472. The second source/drain regions 474 might have a conductivity type the same as the conductivity type of the second extension region 472, but at a higher conductivity level. For example, the second source/drain regions 474 might have an n+ conductivity. The difference in conductivity levels might correspond to different levels of impurities, e.g., dopant species, implanted in the semiconductor 462. The level of impurities of the second source/drain regions 474 might be an order of magnitude or more than the level of impurities of the second extension regions 472.

A second contact 480 might be formed to be connected to each second source/drain region 474. The second contacts 480 might generally be formed of one or more conductive materials. Each second contact 480 might be configured to provide a voltage level at its second source/drain region 474 to a load. For example, the second contact 480 might be configured to connect to a local access line 202 of FIG. 3A.

Figure 5A:
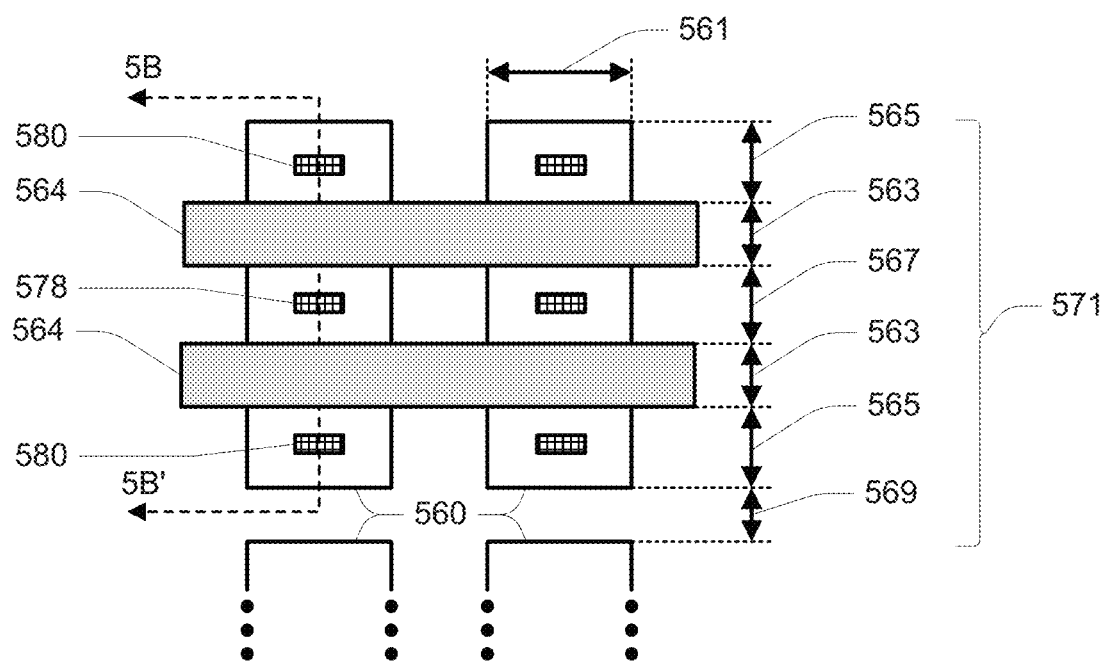
FIG. 5A is a plan view of transistors in accordance with an embodiment.

FIG. 5A is a plan view of transistors in accordance with an embodiment. The transistors of FIG. 5A might be represented by a schematic such as depicted in FIG. 3C. In FIG. 5A, the transistors might be formed in an active area 560 of a semiconductor. Each transistor might be formed between a first contact 578, e.g., for connection to a voltage node, and a second contact 580, e.g., for connection to a load node. Such transistors might be responsive to a control signal received on a conductor 564, which might be connected to (and might form) a control gate of one or more transistors.

Each active area 560 might have a width 561. A distance 563 might represent a width of a conductor 564, a distance 565 might represent the distance between an edge (e.g., nearest edge) of a conductor 564 and an end (e.g., nearest end) of the active area 560, a distance 567 might represent a distance between adjacent edges of the conductors 564, and a distance 569 might represent a distance between adjacent ends of active areas 560. An active area 560 might have a length 571 equal to a sum of each of the distances 563, 565 and 567 between its ends. For some embodiments, the distances 563 and 569 of FIG. 5A might be substantially equal to distances 463 and 469, respectively, of FIG. 4A.

Figure 5B:
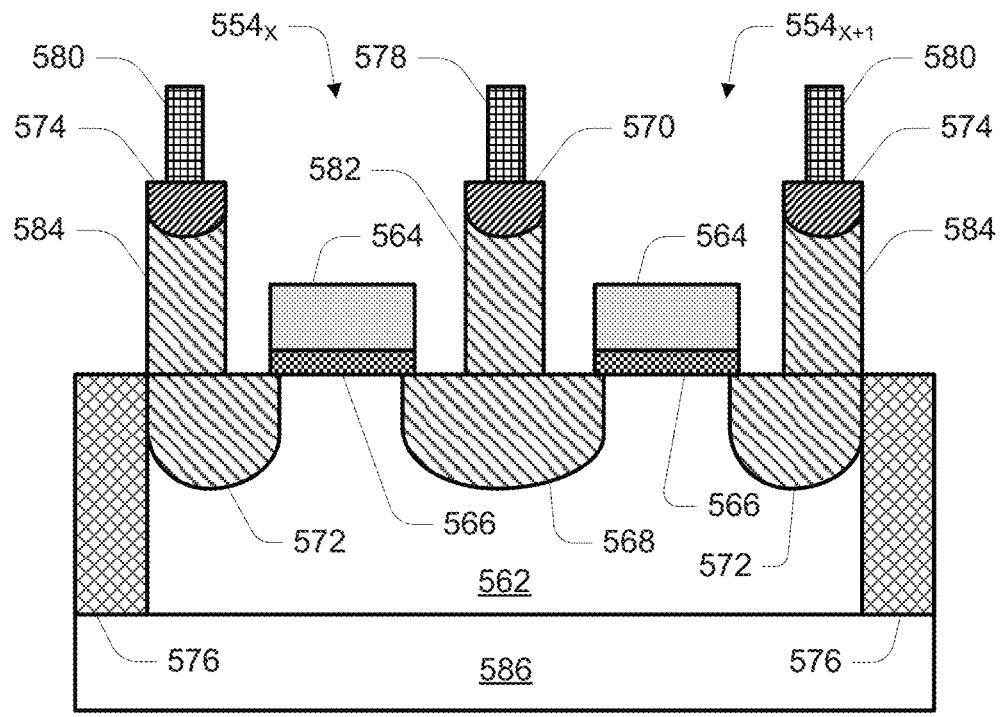
FIG. 5B is a cross-sectional view of transistors of FIG. 5A.

FIG. 5B is a cross-sectional view of transistors of FIG. 5A taken along line 5B-5B'. FIG. 5B depicts two transistors 554, e.g., $554_X$ and $554_{X+1}$, which might correspond to transistors $354_{YX}$ and $354_{Y(X+1)}$ of FIG. 3C. The transistors 554 might be formed overlying (e.g., on) a semiconductor 562 overlying (e.g., on) a substrate 586. The semiconductor 562 might contain monocrystalline silicon or other semiconductor material. The semiconductor 562 might have a conductivity type, e.g., a p-type conductivity. Isolation regions 576 might be formed in the semiconductor 562 to define the active areas 560 of FIG. 5A. The substrate 586 might further contain a semiconductor material. For some embodiments where the substrate 586 contains a semiconductor material, the semiconductor 562 and the substrate 586 might each be formed from a single instance of semiconductor material. For such embodiments, the substrate 586 might have a conductivity type same as or different than (e.g., opposite of) the conductivity type of the semiconductor 562. For example, for embodiments where the substrate 586 has a different conductivity type, the substrate 586 might represent a deep n-well, and the semiconductor 562 might represent a p-well contained within the n-well. For some embodiments, the isolation regions 576 might extend into the substrate 586. For other embodiments, the substrate 586 might contain a dielectric material.

A gate stack of each transistor 554 of FIG. 5B might include a dielectric 566 formed overlying (e.g., on) the semiconductor 562, and a conductor 564 formed overlying (e.g., on) a corresponding dielectric 566. The dielectric 566 might generally be formed of one or more dielectric materials, while the conductor 564 might generally be formed of one or more conductive materials. The dielectric 566 might correspond to a gate dielectric of its corresponding transistor 554, while the conductor 564 might correspond to a control gate of that corresponding transistor 554.

A first extension region base 568 might be formed in the semiconductor 562 between the gate stacks of the transistors 554. The first extension region base 568 might have a conductivity type different than (e.g., opposite of) the conductivity type of the semiconductor 562. Continuing with the example, the first extension region base 568 might have an n-type conductivity. The conductivity level of the first extension region base 568 might be referred to as lightly doped, e.g., having an n− conductivity. To produce an n-type conductivity in a p-type semiconductor, a dopant species might include ions of arsenic (As), antimony (Sb), phosphorus (P) or another n-type impurity. Alternatively, to produce a p-type conductivity in an n-type semiconductor, a dopant species might include ions of boron (B) or another p-type impurity.

A first extension region riser 582 might be formed overlying the first extension region base 568. The first extension region riser 582 might have a conductivity type the same as the conductivity type of the first extension region base 568, and at a similar (e.g., same) conductivity level. The first extension region riser 582 might have similar (e.g., the same) materials of construction as the first extension region base 568. For example, if the semiconductor 562 is monocrystalline silicon, the first extension region riser 582 might be a conductively doped monocrystalline silicon. Alternatively, the first extension region riser 582 might be constructed of other semiconductor materials, different than the semiconductor 562.

A first source/drain region (e.g., source) 570 might be formed in the first extension region riser 582. The first source/drain region 570 might have a conductivity type the same as the conductivity type of the first extension region riser 582, but at a higher conductivity level. For example, the first source/drain region 570 might have an n+ conductivity. The difference in conductivity levels might correspond to different levels of impurities, e.g., dopant species, implanted in the semiconductor material of the first extension region riser 582. The level of impurities of the first source/drain region 570 might be an order of magnitude or more than the level of impurities of the first extension region riser 582. As one example, an n− conductivity might represent an impurity level of 1E16~1E19 ions/cm$^{-3}$ while an n+ conductivity might represent an impurity level of greater than or equal to 1E20 ions/cm$^{-3}$.

A first contact 578 might be formed to be connected to the first source/drain region 570. The first contact 578 might generally be formed of one or more conductive materials. The first contact 578 might be configured to receive a voltage level to provide to the first source/drain region 570. For example, the first contact 578 might be configured to connect to a global access line 302 of FIG. 3A.

A second extension region base 572 might be formed in the semiconductor 562 adjacent each gate stack of the transistors 554. The second extension region base 572 might have a conductivity type different than (e.g., opposite of) the conductivity type of the semiconductor 562. Continuing with the example, the second extension region base 572 might have an n-type conductivity. The conductivity level of the second extension region base 572 might be referred to as lightly doped, e.g., having an n– conductivity.

A second extension region riser 584 might be formed overlying the second extension region base 572. The second extension region riser 584 might have a conductivity type the same as the conductivity type of the second extension region base 572, and at a similar (e.g., same) conductivity level. The second extension region riser 584 might have similar (e.g., the same) materials of construction as the second extension region base 572. For example, if the semiconductor 562 is monocrystalline silicon, the second extension region riser 584 might be a conductively doped monocrystalline silicon. Alternatively, the second extension region riser 584 might be constructed of other semiconductor materials, different than the semiconductor 562.

A second source/drain region (e.g., drain) 574 might be formed in each second extension region riser 584. The second source/drain regions 574 might have a conductivity type the same as the conductivity type of the second extension region riser 584, but at a higher conductivity level. For example, the second source/drain regions 574 might have an n+ conductivity. The difference in conductivity levels might correspond to different levels of impurities, e.g., dopant species, implanted in the semiconductor 562. The level of impurities of the second source/drain regions 574 might be an order of magnitude or more than the level of impurities of the second extension region riser 584.

A second contact 580 might be formed to be connected to each second source/drain region 574. The second contacts 580 might generally be formed of one or more conductive materials. Each second contact 580 might be configured to provide a voltage level at its second source/drain region 574 to a load. For example, the second contact 580 might be configured to connect to a local access line 202 of FIG. 3A.

The use of the first extension region riser 582 and/or the second extension region riser 584 might facilitate a reduction in lateral spacing between the first contact 578 and an isolation region 576 over the structure of FIG. 4B, e.g., in the direction of the length of the transistors. For example, use of the first extension region riser 582 of FIG. 5B might facilitate a reduction in lateral spacing between the first contact 578 and the conductor 564 of a transistor 554. The use of the first extension region riser 582 might further provide a same or increased length of the extension region between the first source/drain region 570 and the channel of a transistor 554 as compared to the extension region between the first source/drain region 470 and the channel of a transistor 454 of FIG. 4B. Similarly, use of the second extension region riser 584 of FIG. 5B might facilitate a reduction in lateral spacing between the second contact 580 and the conductor 564 of a transistor 554. The use of the second extension region riser 584 might further provide a same or increased length of the extension region between the second source/drain region 574 and the channel of a transistor 554 as compared to the extension region between the second source/drain region 474 and the channel of a transistor 454 of FIG. 4B. Furthermore, use of the second extension region riser 584 of FIG. 5B might facilitate a reduction in lateral spacing between the second contact 580 and an adjacent isolation region 576 as there might be no need to laterally separate the second source/drain region 574 from the adjacent isolation region 576 in a manner as depicted between the second source/drain region 474 and an adjacent isolation region 476.

Figure 6A:
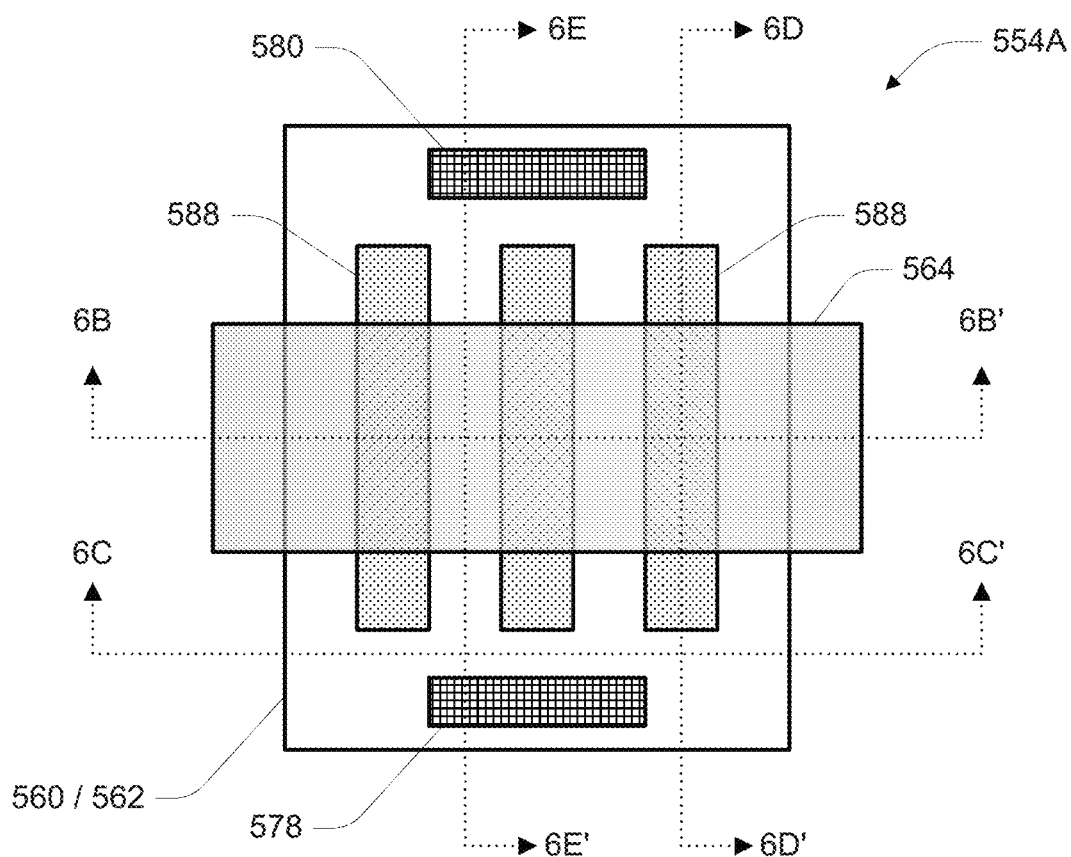
FIG. 6A is a plan view of a transistor in accordance with an embodiment.
Figure 6B:
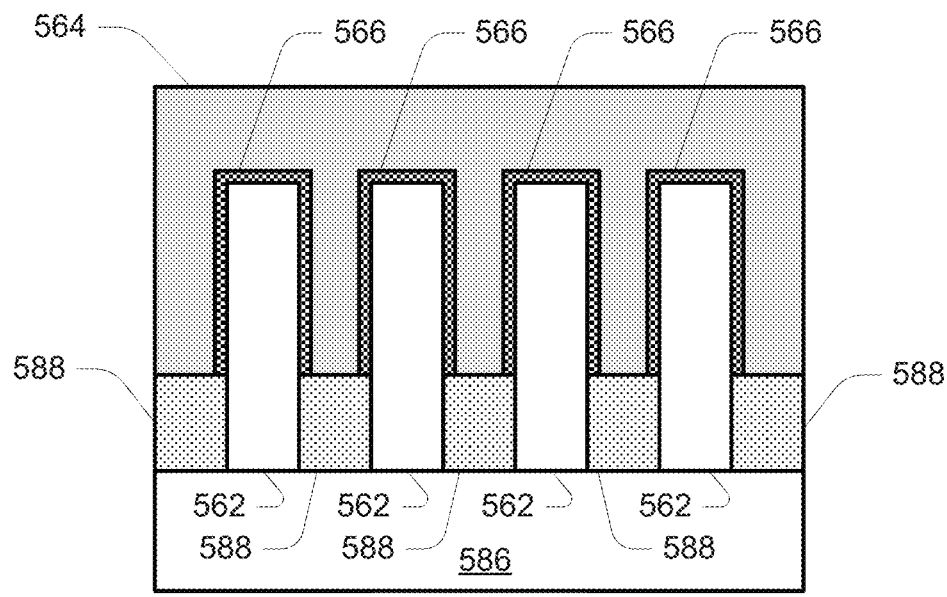
FIGS. 6B-6E are cross-sectional views of the transistor of FIG. 6A.
Figure 6C:
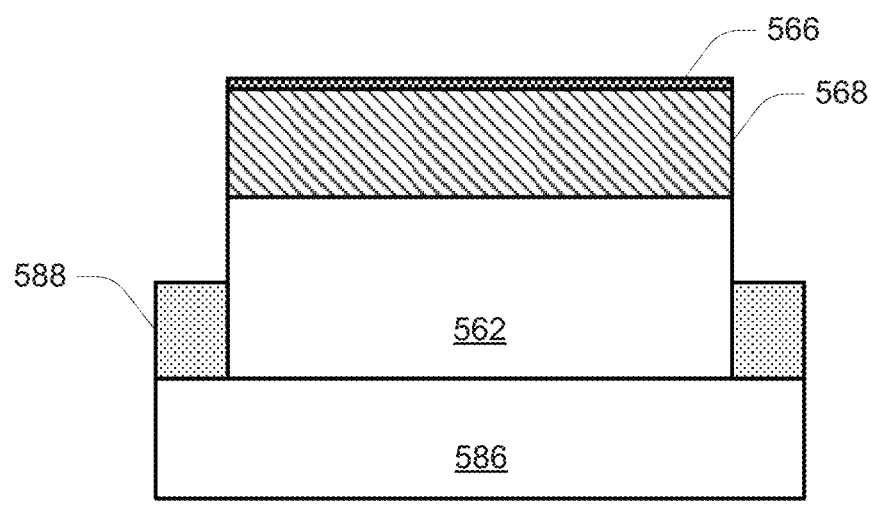
Figure 6D:
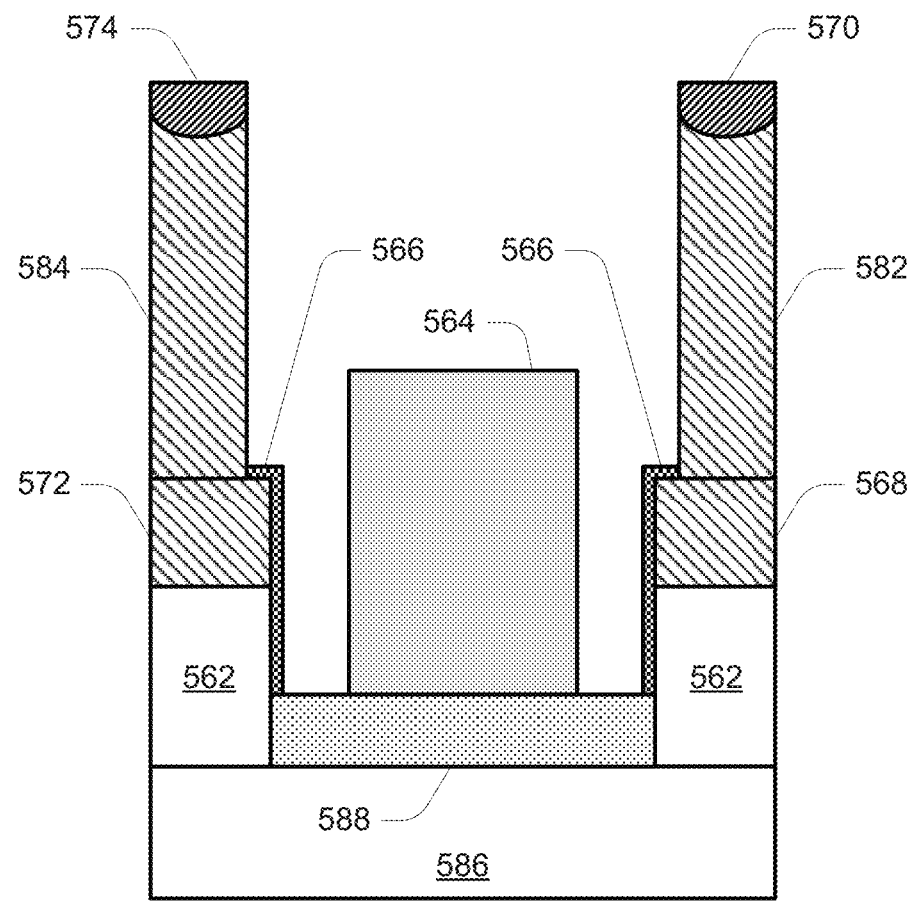
Figure 6E:
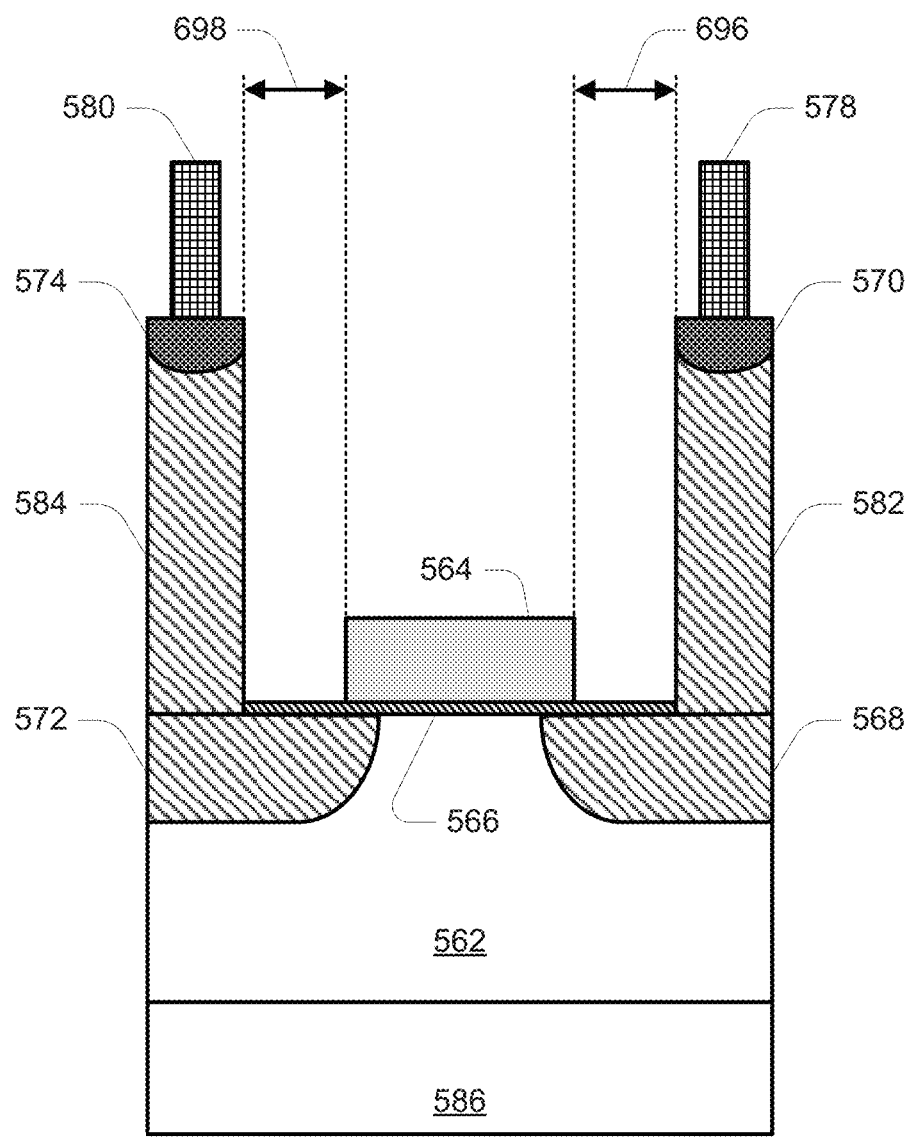

Various embodiments might further incorporate fins in the channel of the transistors 554. Such embodiments might facilitate a reduction in the width 561 of an active area 560 of FIG. 5A relative to the width 461 of an active area 460 of FIG. 4A, e.g., in the direction of the width of the transistors. FIG. 6A is a plan view of a transistor 554A in accordance with an embodiment. FIG. 6B is a cross-sectional view of the transistor 554A taken along line 6B-6B' of FIG. 6A, FIG. 6C is a cross-sectional view of the transistor 554A taken along line 6C-6C' of FIG. 6A, FIG. 6D is a cross-sectional view of the transistor 554A taken along line 6D-6D' of FIG. 6A, and FIG. 6E is a cross-sectional view of the transistor 554A taken along line 6E-6E' of FIG. 6A. Like numbered elements of FIGS. 6A-6E correspond to the description as provided with respect to FIGS. 5A-5B.

FIG. 6A depicts the first contact 578 and the second contact 580 overlying an active area 560 including the semiconductor 562. The conductor 564 might be overlying the semiconductor 562 and dielectric plugs 588. The dielectric plugs 588 might be formed between portions of the semiconductor 562 to define fins between the dielectric plugs 588. For clarity, dielectric material formed outside the boundaries of the active area 560 is not depicted in FIG. 6A.

FIG. 6B depicts portions of the semiconductor 562 defining fins between instances of the dielectric plugs 588. For some embodiments, the fins of the semiconductor 562 might have an aspect ratio (e.g., height over width) in the range of 2 to 4. For some embodiments, the fins of the semiconductor 562 might have a height of 500 nm±300 nm. The dielectric plugs 588 might have a height less than the height of the fins of the semiconductor 562. For some embodiments, the dielectric plugs 588 might have a height of 100 nm±30 nm. The dielectric plugs 588 might have a height sufficient to mitigate formation of parasitic transistors between the conductor and the substrate 586. For some embodiments, the height of the fins of the semiconductor 562 might be in a range of 5 to 15 times the height of the dielectric plugs 588.

A dielectric (e.g., gate dielectric) 566 might be formed overlying (e.g., on) portions of the fins of the semiconductor 562, e.g., overlying an upper surface and portions of sidewalls of a fin of the semiconductor 562. For example, the dielectric 566 might be formed on portions of the fins of the semiconductor 562 extending beyond (e.g., above) the dielectric plugs 588. The conductor (e.g., control gate) 564 might be formed to extend between and overlying the fins of the semiconductor 562. The conductor 564 might extend to a surface (e.g., upper surface) of the dielectric plugs 588. With the dielectric 566 formed to be overlying an upper surface and sidewalls of a fin of the semiconductor 562, the effective operational width of the transistor 554A might be increased while decreasing a physical width of the transistor 554A, e.g., decreasing the width 561 of an active area 560. Although the example of FIG. 6B depicts four fins of the semiconductor 562, more or fewer fins could be used.

FIG. 6C depicts a dielectric 566 optionally overlying a first extension region base 568 in a portion of the semiconductor 562. Instances of dielectric plugs 588 might be formed adjacent sidewalls of the semiconductor 562 overlying the substrate 586. FIG. 6C depicts that the fins of the semiconductor 562 might not extend a full width of an active area, e.g., the portion of the semiconductor 562 depicted in FIG. 6C might bridge gaps between the fins of the semiconductor 562 depicted in FIG. 6B.

FIG. 6D depicts a dielectric 566 optionally overlying an upper surface and sides walls of a first extension region base 568 and a second extension region base 572, as well as sidewalls of portions of the semiconductor 562. An instance of a dielectric plug 588 might be formed between the portions of the semiconductor 562 and overlying the substrate 586. A conductor 564 might be formed overlying the dielectric plug 588. A first extension region riser 582 might be formed overlying the first extension region base 568, and a first source/drain region 570 might be formed in the first extension region riser 582. A second extension region riser 584 might be formed overlying the second extension region base 572, and a second source/drain region 574 might be formed in the second extension region riser 584. In the embodiment depicted in FIG. 6D, the fins of the semiconductor do not extend a full length of the active area. However, other embodiments might pattern the semiconductor 562 to define fins extending the full length of the active area.

FIG. 6E depicts a dielectric 566 overlying a semiconductor 562 and optionally overlying an upper surface of a first extension region base 568 and a second extension region base 572. A conductor 564 might be formed overlying the gate dielectric 566. A first extension region riser 582 might be formed overlying the first extension region base 568, and a first source/drain region 570 might be formed in the first extension region riser 582. A second extension region riser 584 might be formed overlying the second extension region base 572, and a second source/drain region 574 might be formed in the second extension region riser 584. A first contact 578 might be formed to be connected to the first source/drain region 570. A second contact 580 might be formed to be connected to the second source/drain region 574. FIG. 6E further depicts that the distance (e.g., lateral distance) 696 between the first extension region riser 582 and the conductor 564 might be different than the distance (e.g., lateral distance) 698 between the second extension region riser 584 and the conductor 564. For example, if it is desired to have different lengths of the extension regions between the source side and the drain side of the transistor 554A, e.g., due to an expected voltage drop across the transistor 554A, having different distances 696 and 698 might facilitate obtaining differing lengths of extension regions while maintaining a same height of the extension region risers 582 and 584. For example, the distance 696 might be larger than the distance 698. This variation of distances 696 and 698 might also be utilized in transistor configurations in accordance with other embodiments, e.g., such as depicted in FIG. 5B.

FIGS. 7A-7M are cross-sectional views of the transistors of FIG. 5B at various states of fabrication in accordance with an embodiment. Like numbered elements in FIGS. 7A-7M correspond to the description as provided with respect to FIGS. 5A-5B.

Figure 7A:
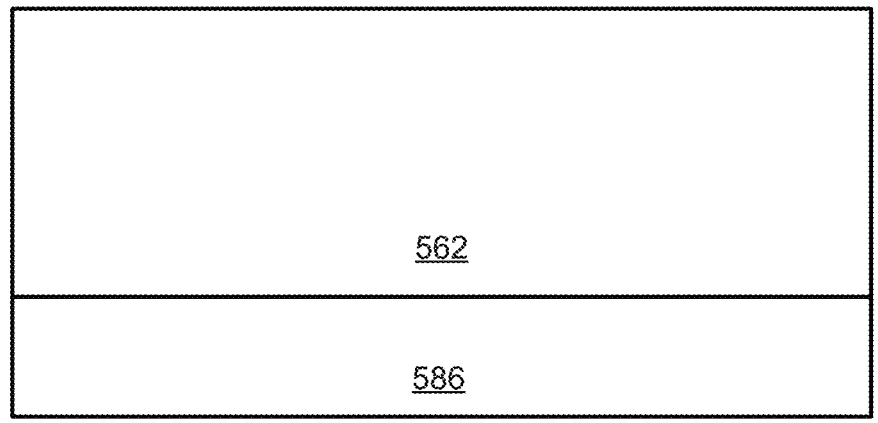
FIGS. 7A-7M are cross-sectional views of the transistors of FIG. 5B at various states of fabrication in accordance with an embodiment.

In FIG. 7A, a semiconductor 562 might be formed overlying, e.g., on, a substrate 586. The semiconductor 562 may comprise silicon, such as monocrystalline silicon, or other semiconductor material. The semiconductor 562 might have a conductivity type, such as a p-type conductivity. The substrate 586 might further contain a semiconductor material. For other embodiments, the substrate 586 might contain a dielectric material. For some embodiments where the substrate 586 contains a semiconductor material, the semiconductor 562 and the substrate 586 might represent two portions of a single instance of semiconductor material. For some embodiments, the isolation regions 576 might extend into the substrate 586.

Figure 7B:
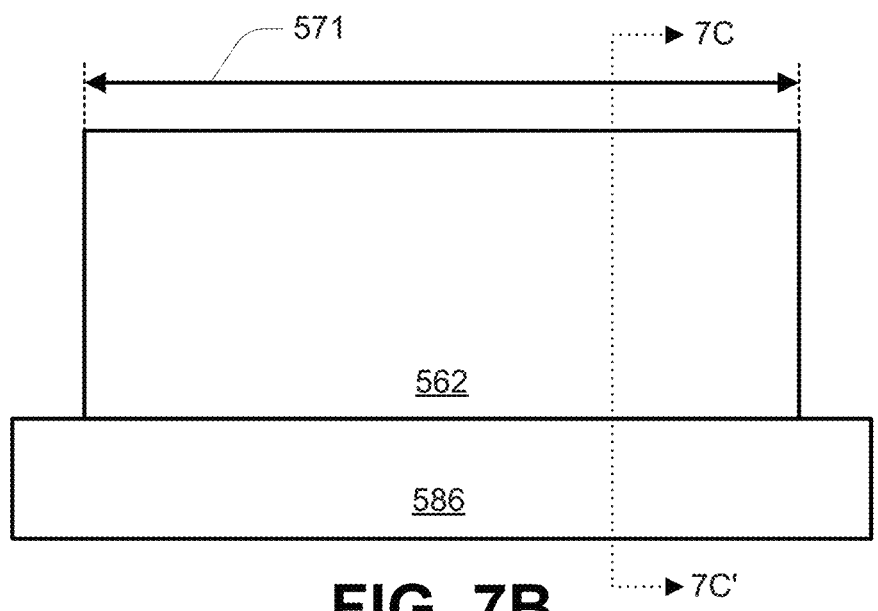
Figure 7C:
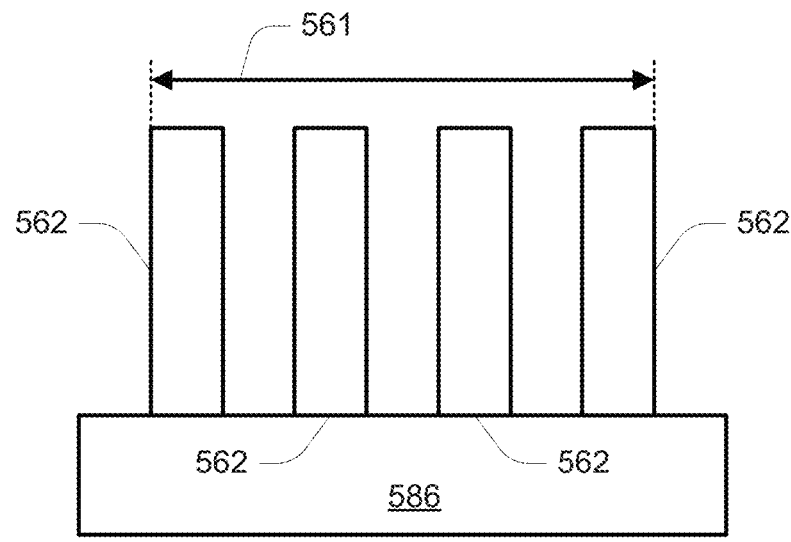

In FIGS. 7B and 7C, the semiconductor 562 might be patterned to define a width 561 of an active area and to define fins of the semiconductor 562. FIG. 7B might depict the view of FIG. 7A following patterning of the semiconductor 562, while FIG. 7C might depict the cross-sectional view of FIG. 7B taken along line 7C-7C'. Patterning might include removal of portions of the semiconductor 562 using photolithographic techniques or other processes for the selective removal of a material. The fins of the semiconductor 562 might extend orthogonal to the width 561 of an active area. For some embodiments, the cross-section of FIG. 7C might extend less than the length 571 of the active area of FIG. 7B. For example, formation of the fins of the semiconductor 562 might form closed trenches, e.g., container-shaped cavities, between the fins of the semiconductor 562. For other embodiments, the cross-section of FIG. 7C might extend the full length 571 of the active area of FIG. 7B. For example, formation of the fins of the semiconductor 562 might form open trenches between the fins of the semiconductor 562, e.g., with no portion of the semiconductor 562 bridging a gap between two fins of the semiconductor 562.

Figure 7D:
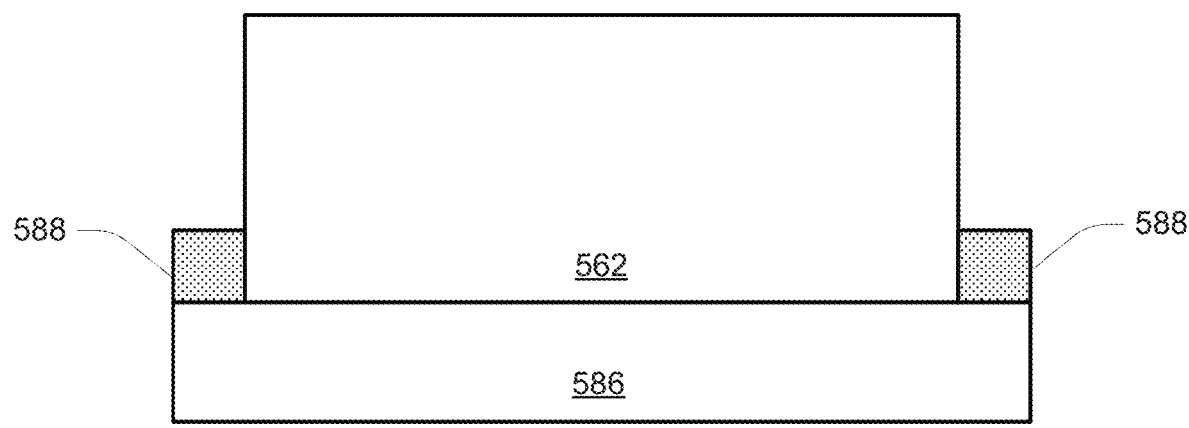
Figure 7E:
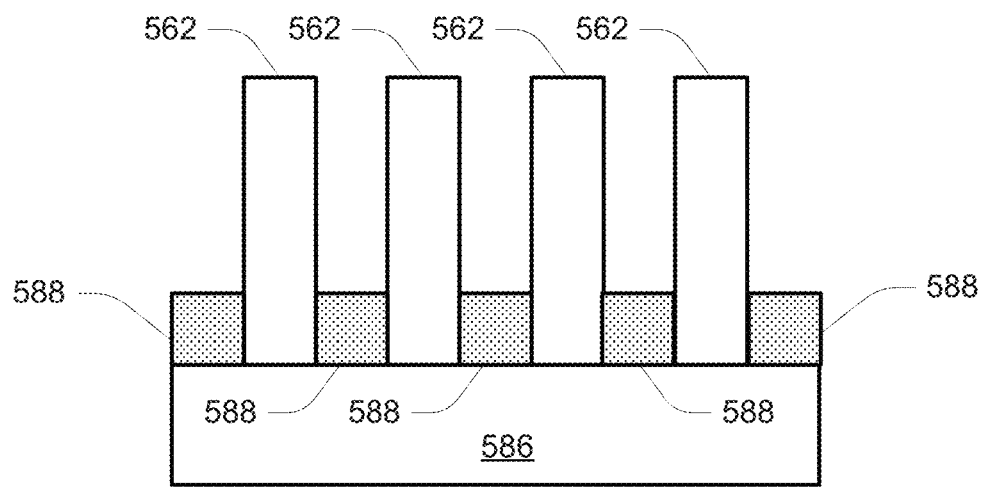

In FIGS. 7D and 7E, plugs 588 of a dielectric material might be formed overlying (e.g., on) exposed portions of the substrate 586. FIG. 7D corresponds to the structure depicted in FIG. 7B and FIG. 7E corresponds to the structure depicted in FIG. 7C. The dielectric plugs 588 might contain one or more dielectric materials. For example, the dielectric plugs 588 may comprise, consist of, or consist essentially of an oxide, e.g., silicon dioxide, and/or may comprise, consist of, or consist essentially of a high-K dielectric material, such as aluminum oxides ($AlO_x$), hafnium oxides ($HfO_x$), hafnium aluminum oxides ($HfAlO_x$), hafnium silicon oxides ($HfSiO_x$), lanthanum oxides ($LaO_x$), tantalum oxides ($TaO_x$), zirconium oxides ($ZrO_x$), zirconium aluminum oxides ($ZrAlO_x$), or yttrium oxide ($Y_2O_3$), as well as any other dielectric material. The dielectric plugs 588 might be formed by blanket depositing a dielectric material followed by an etch-back to obtain a desired height of the dielectric plugs 588.

Figure 7F:
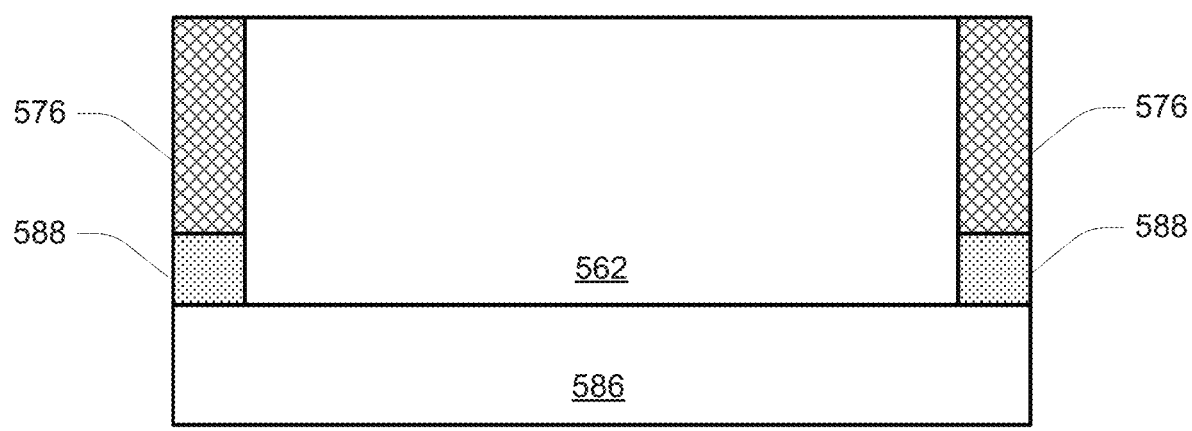

In FIG. 7F, portions of isolation regions 576 might be formed adjacent the semiconductor 562. Isolation regions 576 might represent shallow-trench isolation structures as are well understood in the relevant art. For example, the isolation regions 576 might be formed by filling trenches (not shown) adjacent the active area with one or more dielectric materials.

Figure 7G:
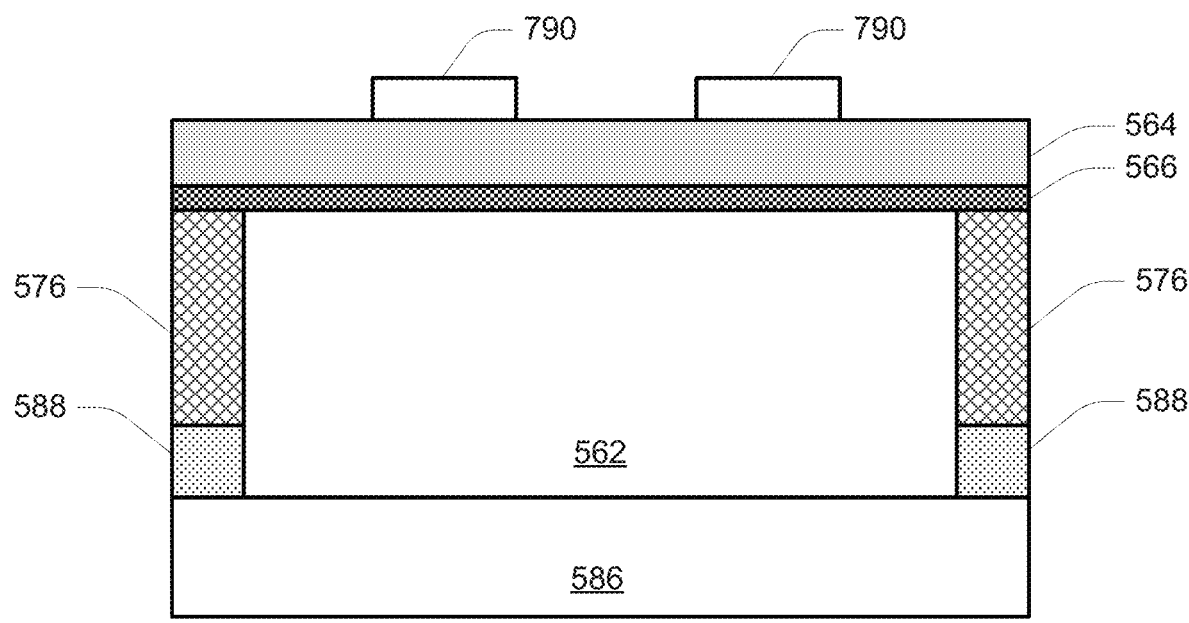

In FIG. 7G, a dielectric 566 might be formed overlying (e.g., on) the structure of FIG. 7F, e.g., overlying the semiconductor 562 and isolation regions 576. The dielectric 566 might be formed of one or more dielectric materials. For example, the dielectric 566 may comprise, consist of, or consist essentially of an oxide, e.g., silicon dioxide, and/or may comprise, consist of, or consist essentially of a high-K dielectric material, such as aluminum oxides ($AlO_x$), hafnium oxides ($HfO_x$), hafnium aluminum oxides ($HfAlO_x$), hafnium silicon oxides ($HfSiO_x$), lanthanum oxides ($LaO_x$), tantalum oxides ($TaO_x$), zirconium oxides ($ZrO_x$), zirconium aluminum oxides ($ZrAlO_x$), or yttrium oxide ($Y_2O_3$), as well as any other dielectric material. The dielectric 566 might contain a same, or different, dielectric material or materials as the dielectric plugs 588.

A conductor 564 might be formed overlying (e.g., on) the dielectric 566. The conductor 564 might be formed of one or more conductive materials. The conductor 564 may comprise, consist of, or consist essentially of conductively doped polysilicon and/or may comprise, consist of, or consist essentially of metal, such as a refractory metal, or a metal-containing material, such as a refractory metal silicide or a metal nitride, e.g., a refractory metal nitride, as well as any other conductive material.

A patterned mask 790 might be formed overlying (e.g., on) the conductor 564 to expose areas of the conductor 564 and dielectric 566 for removal. The mask 790 might represent a mask formed using a photolithographic process. Photolithographic processes are often used to define a desired pattern in integrated circuit fabrication. In a photolithographic process, a photoresist layer may be formed on the surface of the in-process device. The photoresist layer may contain a photo-sensitive polymer whose ease of removal is altered upon exposure to light or other electromagnetic radiation. To define the pattern, the photoresist layer may be selectively exposed to radiation and then developed to expose portions of the underlying layer. In a positive resist system, the portions of the photoresist layer exposed to the radiation are photosolubilized and a photolithographic mask is designed to block the radiation from those portions of the photoresist layer that are to remain after developing. In a negative resist systems, the portions of the photoresist layer exposed to the radiation are photopolymerized and the photolithographic mask is designed to block the radiation from those portions of the photoresist layer that are to be removed by developing.

Figure 7H:
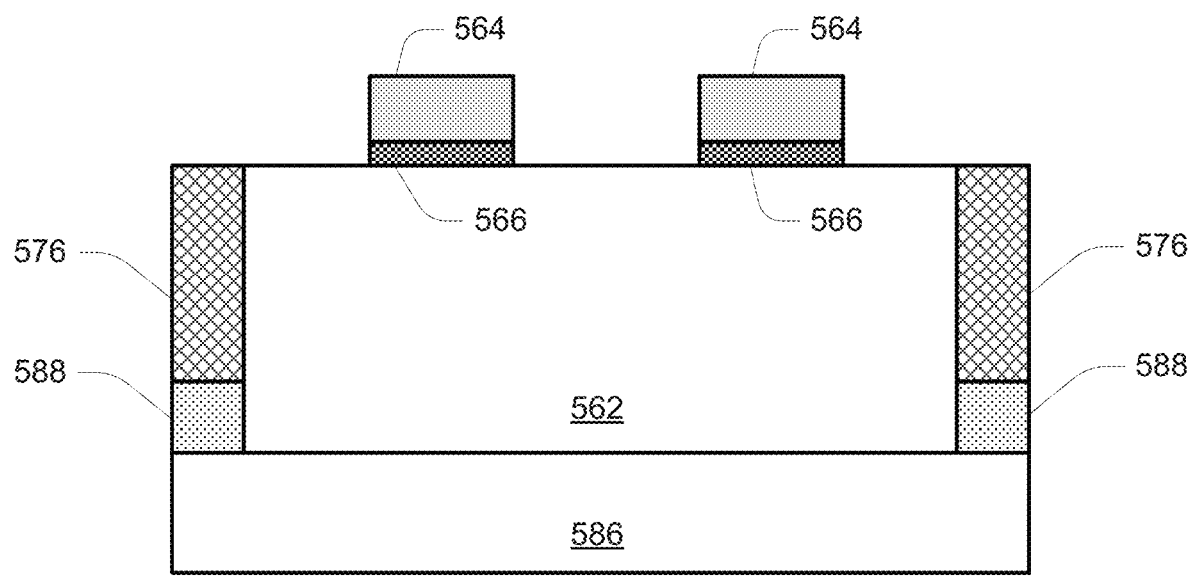

In FIG. 7H, the exposed areas of the conductor 564 and the dielectric 566 might be removed, e.g., anisotropically. For example, a reactive ion etch process might be used to remove portions of the conductor 564 and the dielectric 566 not covered by the patterned mask 790. The mask 790 might subsequently be removed, e.g., by ashing or otherwise removing the photoresist material. Remaining portions of the conductor 564 might represent control gates of the future transistors.

Figure 7I:
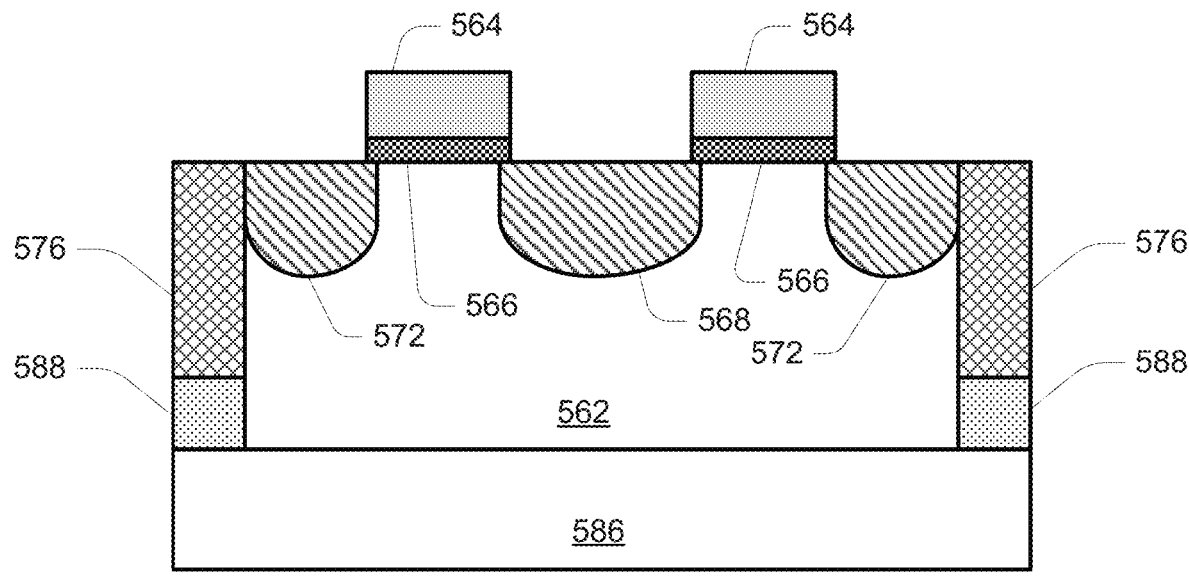

In FIG. 7I, the first extension region base 568 and the second extension region bases 572 might be formed. The first extension region base 568 might extend beyond one edge of each conductor 564, while each second extension region base 572 might extend beyond an opposite edge of its corresponding conductor 564. The second extension region bases 572 might further extend to corresponding isolation regions 576. Forming these extension region bases 568 and 572 might include conductively doping portions of the semiconductor 562 not covered by the conductor 564. For example, the first extension region base 568 and the second extension region bases 572 might be formed by implanting respective dopant species into the semiconductor 562. As is well understood in the art, such implantation might commonly involve acceleration of ions directed at a surface of the semiconductor 562. To produce an n-type conductivity, the dopant species might include ions of arsenic (As), antimony (Sb), phosphorus (P) or another n-type impurity. To produce a p-type conductivity, the dopant species might include ions of boron (B) or another p-type impurity. Other methods of forming conductive regions in a semiconductor are known. Although implanting dopant species might be self-aligned to the gate stacks, it might further be expected for the extension region bases 568 and 572 to extend beneath the conductors 564. A channel region would be the area underlying the dielectric 566 between the first extension region base 568 and a corresponding second extension region base 572. For some embodiments, the fins of the semiconductor 562 might extend a full length of the channel region. For further embodiments, the fins of the semiconductor 562 might extend beyond the full length of the channel region.

Figure 7J:
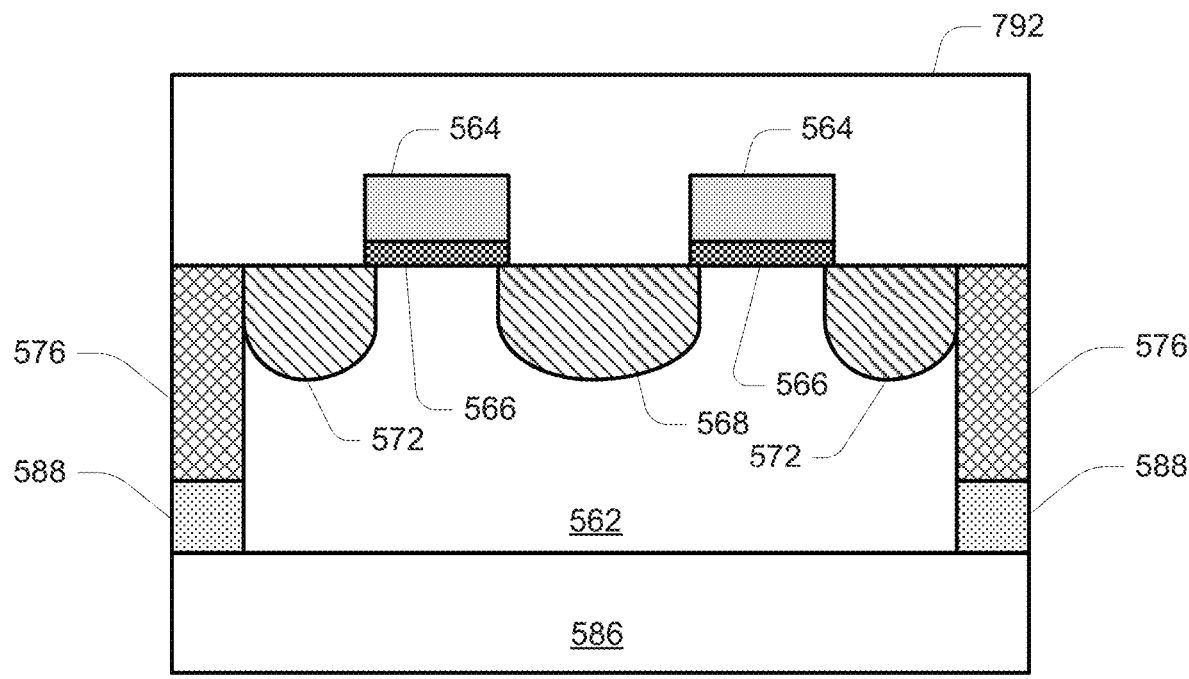
Figure 7K:
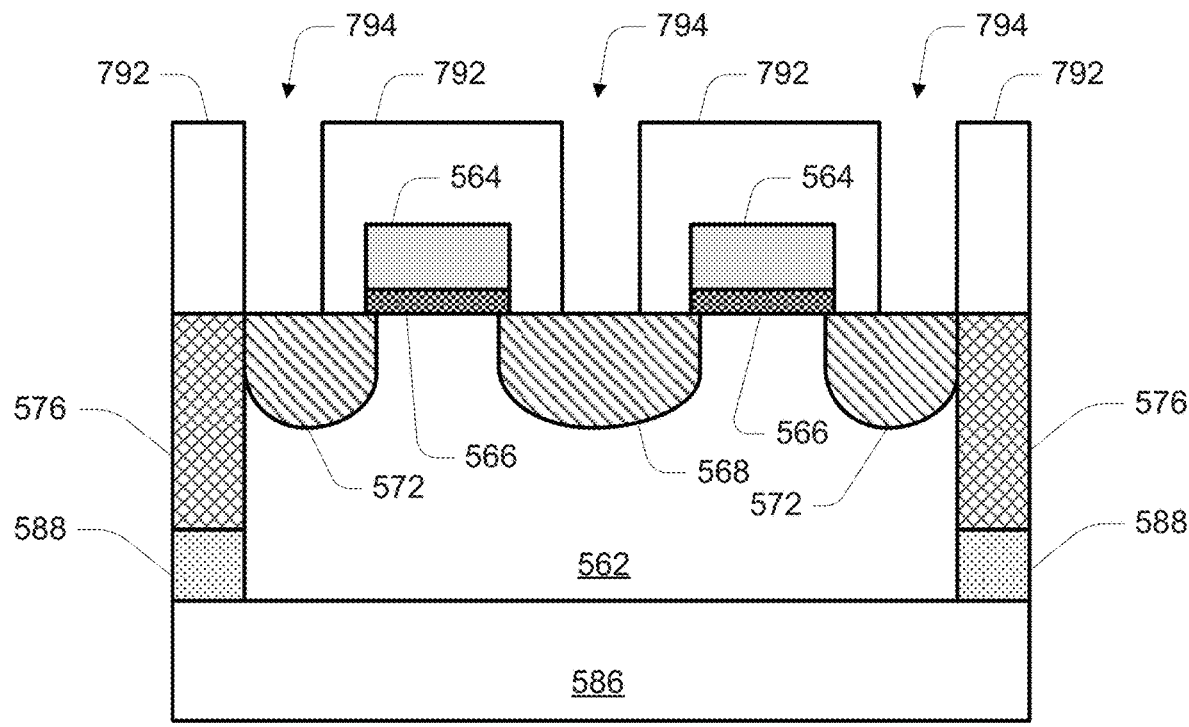
Figure 7L:
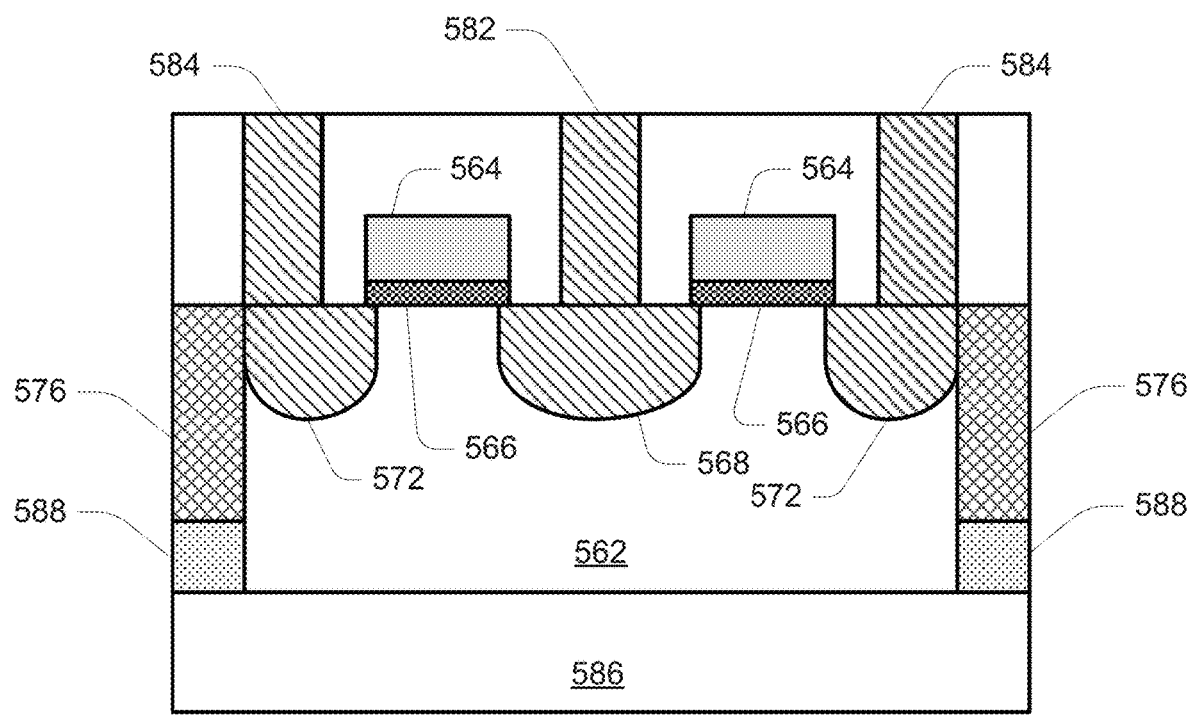

In FIG. 7J, a dielectric 792 might be formed overlying the structure of FIG. 7I. The dielectric 792 might contain one or more dielectric materials. In FIG. 7K, voids 794 might be formed in the dielectric 792 to define areas for formation of the extension region risers. For example, portions of the dielectric 792 might be anisotropically removed to define voids 794. In FIG. 7L, the first extension region riser 582 and the second extension region risers 584 might be formed, e.g., concurrently. Top surfaces of the first extension region riser 582 and the second extension region risers 584 might be above top surfaces of the conductors 564. The first extension region riser 582 and the second extension region risers 584 might be formed of material having characteristics similar to their corresponding first extension region base 568 and second extension region bases 572. As one example, where the semiconductor 562 contains monocrystalline silicon, amorphous or polycrystalline silicon (commonly referred to as polysilicon) might be formed in the voids 794 using chemical vapor deposition (CVD), physical vapor deposition (PVD) or atomic layer deposition (ALD), and subsequently crystallized to mimic the characteristics of the underlying extension region bases. This might be accomplished by solid phase epitaxy. For example, solid phase epitaxy might include a low temperature (e.g., 700° C. for 30 minutes) anneal.

Alternatively, a selective epitaxial growth of monocrystalline silicon might be used to form the risers. Epitaxial formation of silicon is a CVD process. The process can replicate the structure of the silicon material upon which it is formed. For example, if the base structure is of monocrystalline silicon, the epitaxial growth might maintain the same monocrystalline structure. Silicon precursors are transported to, and adsorbed on, the exposed silicon structures. Common silicon precursors for the production of epitaxial silicon include silicon tetrachloride ($SiCl_4$), trichlorosilane ($SiHCl_3$), dichlorosilane ($SiH_2Cl_2$) and silane ($SiH_4$). As a further alternative, epitaxial growth of high band-gap semiconductors might also be used. High band-gap semiconductors might be defined as semiconductors having a band gap of 1.7 eV or greater. Some high band-gap semiconductors, e.g., gallium phosphide (GaP), might be epitaxially grown on silicon to contain a single crystal lattice of that high band-gap semiconductor.

Regardless of the method of formation, conductive doping of the first extension region riser 582 and the second extension region risers 584 might be performed in conjunction with formation, or subsequent to formation. Conductive doping of the extension region risers 582 and 584 might use a same type (e.g., n-type or p-type) of doping impurity as the extension region bases 568 and 572, but to a higher level. The doping impurity might further be the same material for both the extension region risers and the extension region bases.

Figure 7M:
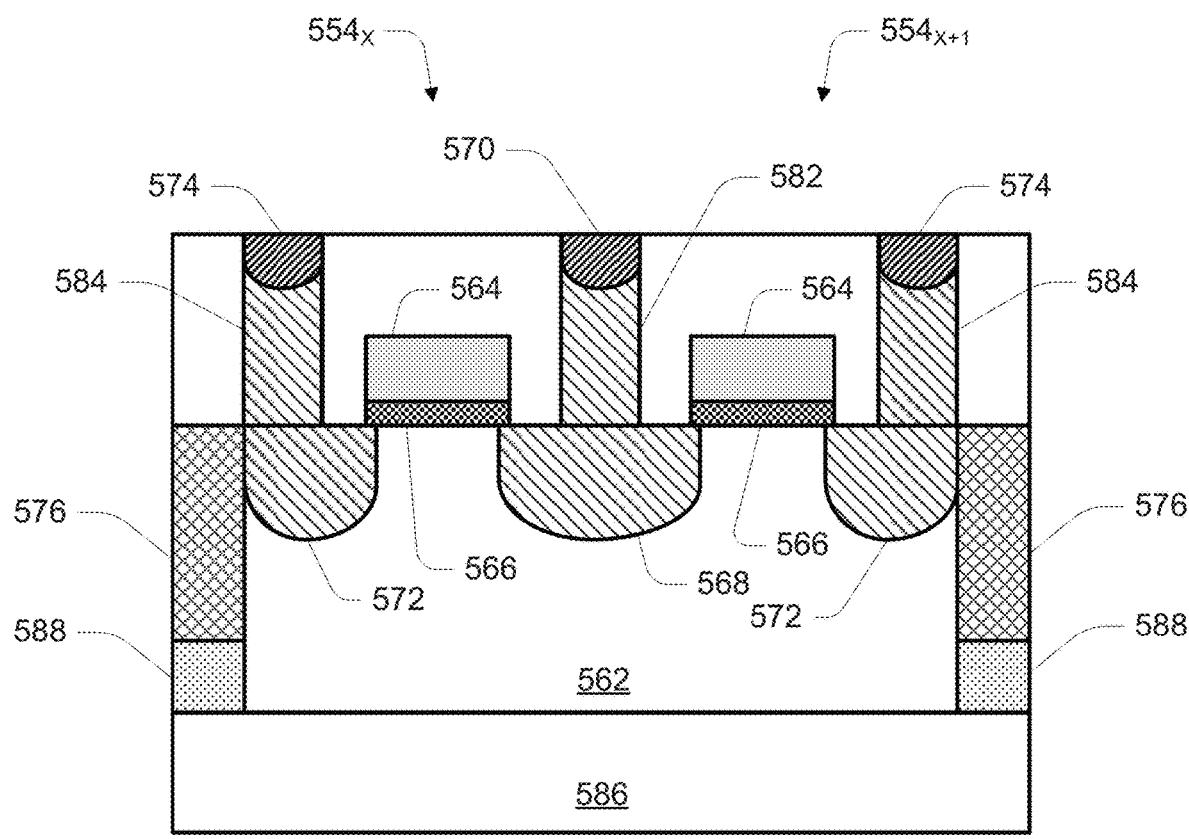

In FIG. 7M, the first source/drain region 570 and the second source/drain regions 574 might be formed in the first extension region riser 582 and the second extension region risers 584, respectively. Bottom surfaces of the first source/drain region 570 and the second source/drain regions 574 might be above top surfaces of the conductors 564. Formation of the source/drain regions 570 and 574 might include conductively doping the extension region risers 582 and 584 using a same type (e.g., n-type or p-type) of doping impurity as the extension region risers, but to a higher level. The doping impurity might further be the same material for both the extension region risers 582 and 584, and the source/drain regions 570 and 574. Contacts 578 and 580 (not shown in FIG. 7M) might then be formed to be in contact with the source/drain regions 570 and 574, respectively. Although FIGS. 7A-7M described a method of forming the transistors 554 of FIG. 5B corresponding to a schematic as depicted in FIG. 3C, forming a transistor 554 corresponding to a schematic of FIG. 3B would be readily apparent with reference to the description of FIGS. 7A-7M.

Although not depicted in FIGS. 7A-7M, a first set of fins of the semiconductor 562 might be formed to extend from the first extension region base 568 to one of the second extension region bases 572, and a second set of fins of the semiconductor 562 might be formed to extend from the first extension region base 568 to the other one of the second extension region bases 572. Each set of fins of the semiconductor 562 might not extend through the first extension region base 568 to make contact with one another, e.g., similar to the example of FIG. 6D. Formation of such fins of the semiconductor 562 might form closed trenches in the semiconductor 562. Alternatively, the example of FIGS. 7A-7M might include a single set of fins of the semiconductor 562 for both transistors depicted. Formation of such fins of the semiconductor 562 might form open trenches in the semiconductor 562.

Figure 8A:
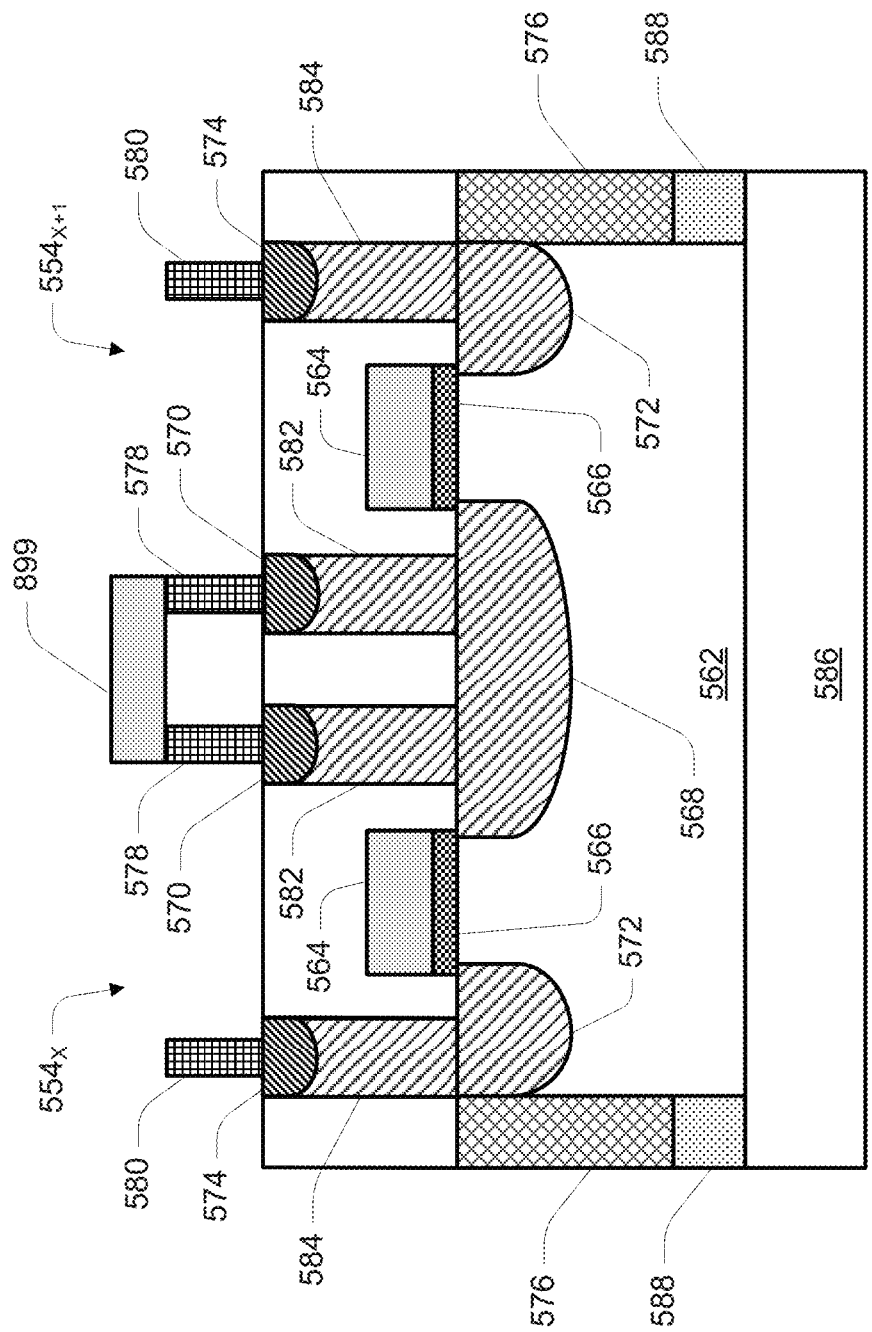
FIGS. 8A-8B are cross-sectional views of transistors in accordance with further embodiments.
Figure 8B:
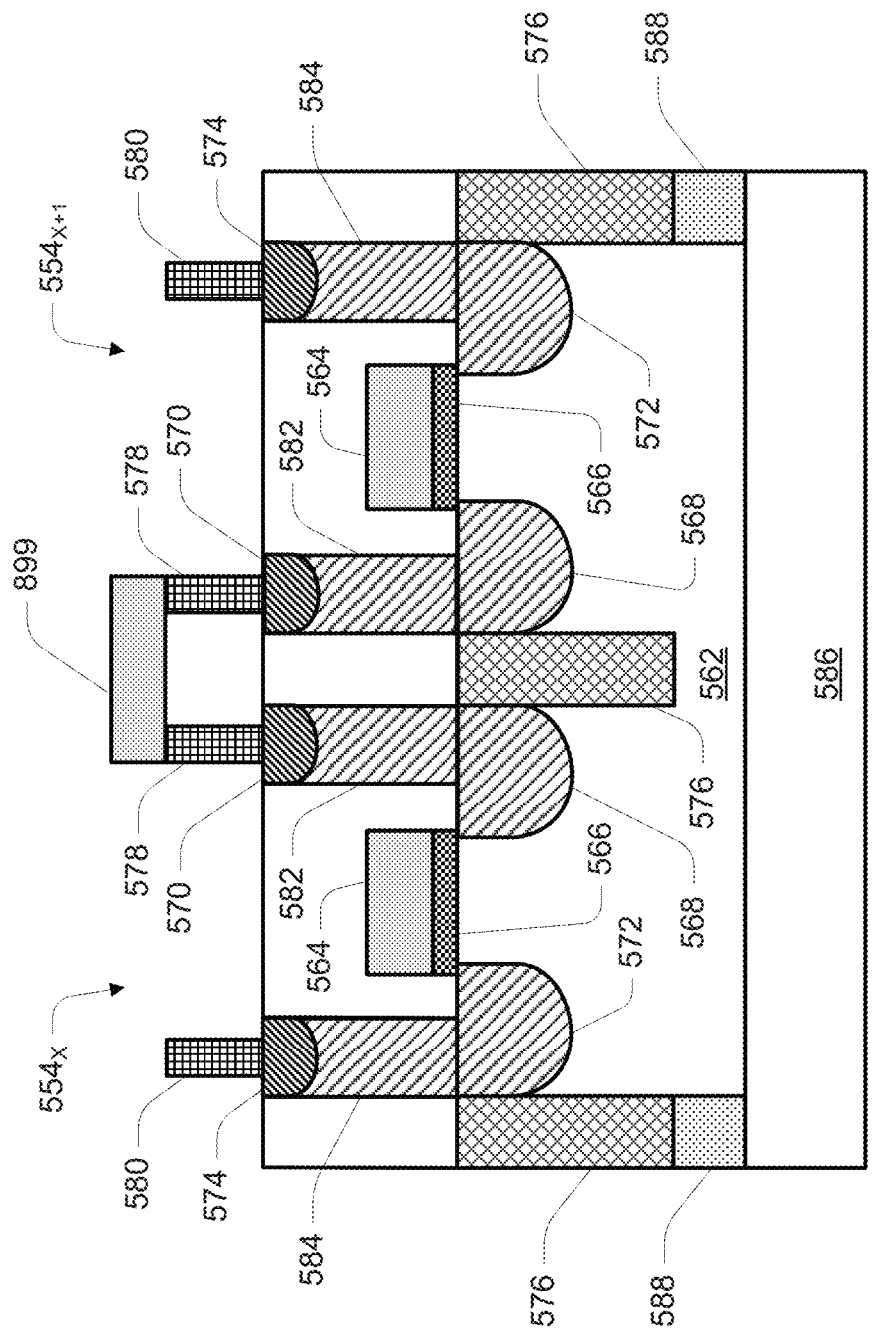

FIGS. 8A-8B are cross-sectional views of transistors 554 in accordance with further embodiments. Like numbered elements in FIGS. 8A-8B correspond to the description as provided with respect to FIGS. 5A-5B.

The embodiment of FIG. 8A, like the embodiments of FIGS. 5B and 7M, might correspond schematically to the circuit of FIG. 3C. However, instead of having a shared first extension region base 568, a shared first extension region riser 582, and a shared first contact 578, the embodiment of FIG. 8A might utilize a shared first extension region base 568, but two first extension region risers 582, two first source/drain regions 570, and two first contacts 578, e.g., one set for each transistor 554. The first contacts 578 might be electrically connected, e.g., shorted, to one another using a conductor 899 connected to each first contact 578 of the transistors $554_X$ and $554_{X+1}$. The conductor 899 might be formed of one or more conductive materials, and might be connected to the voltage node, e.g., a global access line 302.

The embodiment of FIG. 8B, like the embodiments of FIGS. 5B and 7M, might correspond schematically to the circuit of FIG. 3C. However, instead of having a shared first extension region base 568, a shared first extension region riser 582, and a shared first contact 578, the embodiment of FIG. 8B might utilize two first extension region bases 568, two first extension region risers 582, two first source/drain regions 570, and two first contacts 578, e.g., one set for each transistor 554. The first contacts 578 might be electrically connected, e.g., shorted, to one another using a conductor 899 connected to each first contact 578 of the transistors $554_X$ and $554_{X+1}$. The conductor 899 might be formed of one or more conductive materials, and might be connected to the voltage node, e.g., a global access line 302. The two first extension region bases 568 might be separated by an isolation region 576, e.g., they might be electrically isolated from one another but for their connection through their corresponding first extension region risers 582, their corresponding first source/drain regions 570, their corresponding first contacts 578, and the conductor 899.

Figure 9B:
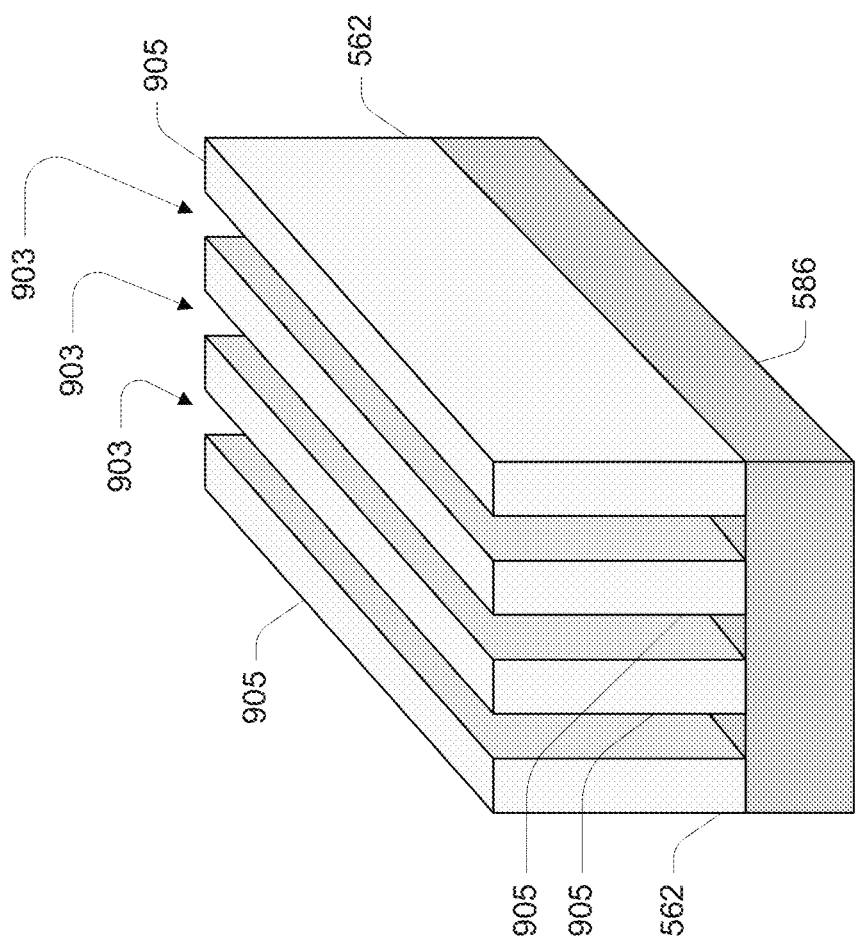
FIGS. 9A-9B are perspective views of a semiconductor having fins in accordance with embodiments.
Figure 9A:
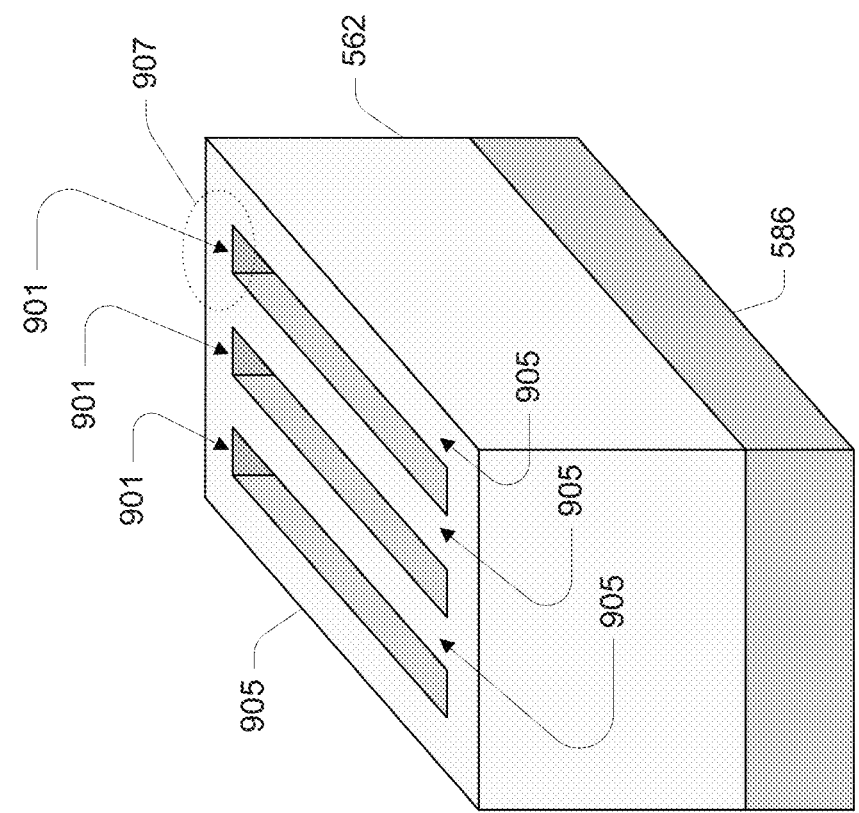

FIG. 9A depicts an example of closed trenches 901 formed in the semiconductor 562 to define fins 905. The closed trenches 901 might extend to a surface (e.g., upper surface) of the substrate 586. A portion 907 of the semiconductor 562 might bridge a gap defined by a closed trench 901 between two of the fins 905 in the semiconductor 562. Although not enumerated in the drawing, the semiconductor 562 might include portions bridging the gap between each pair of fins 905 of the semiconductor 562 at both ends of each closed trench 901. The structure depicted in FIG. 9A might define an active area 560 for the formation of two transistors, e.g., transistor $554_X$ and $554_{X+1}$ of FIG. 5B. Alternatively, the structure depicted in FIG. 9A might define a contiguous portion of an active area 560 extending for a distance 565, plus a distance 563, plus one-half the distance 567, for the formation of one transistor, e.g., transistor $554_X$ or $554_{X+1}$ of FIG. 5B. For such an embodiment, the active area 560 might include the structure depicted in FIG. 9A and its mirror image, with the fins 901 of each structure extending in the direction of the length 571 of the active area 560.

FIG. 9B depicts an example of open trenches 903 formed in the semiconductor 562 to define fins 905. The open trenches 903 might extend to a surface (e.g., upper surface) of the substrate 586. The structure depicted in FIG. 9B might define an active area 560 for the formation of two transistors, e.g., transistor $554_X$ and $554_{X+1}$ of FIG. 5B.

Figure 10:
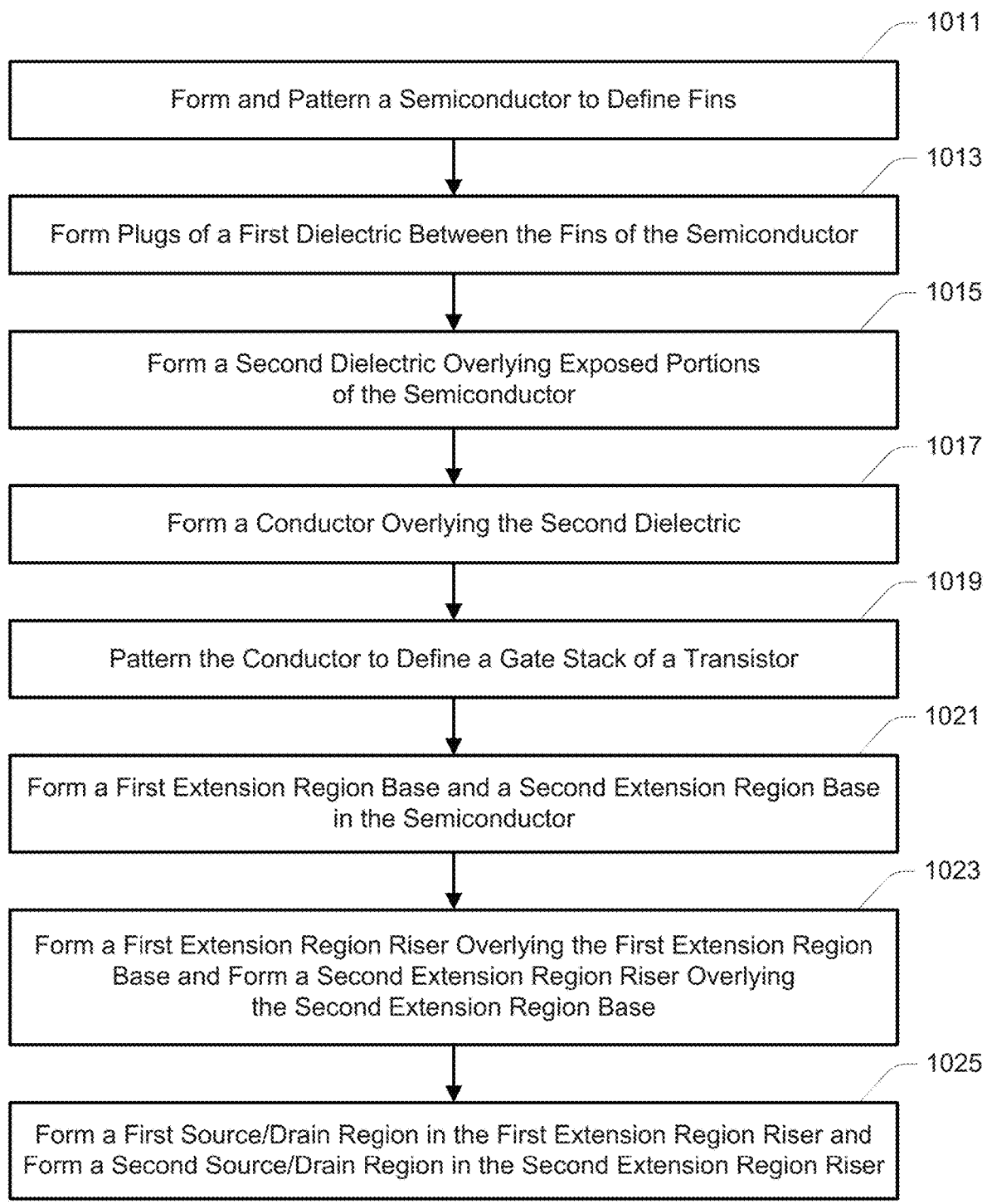
FIG. 10 is a flowchart of a method of forming a transistor in accordance with an embodiment.

FIG. 10 is a flowchart of a method of forming a transistor in accordance with an embodiment. At 1011 a semiconductor might be formed and patterned to define fins. For example, a semiconductor 562 might be formed and patterned to define fins 901 or 903. The semiconductor might have a first conductivity type. At 1013, plugs of a first dielectric might be formed between the fins of the semiconductor. For example, dielectric plugs 588 might be formed.

At 1011, a second dielectric might be formed overlying the semiconductor. For example, a dielectric 566 might be formed. At 1017, a conductor might be formed overlying the second dielectric. For example, a conductor 564 might be formed. At 1019, the conductor might be patterned to define a gate stack of the transistor. For some embodiments, the second dielectric might be concurrently patterned with the conductor.

At 1021, a first extension region base and a second extension region base might be formed in the semiconductor. For example, a first extension region base 568 and a second extension region base 572 might be formed. The first extension region base and the second extension region base might have a second conductivity type, different than the first conductivity type. The first extension region base and the second extension region base might further have a first conductivity level.

At 1023, a first extension region riser and a second extension region riser might be formed. For example, a first extension region riser 582 and a second extension region riser 584 might be formed. The first extension region riser might be formed overlying the first extension region base, and the second extension region riser might be formed overlying the second extension region base. The first extension region riser and the second extension region riser might have the second conductivity type. The first extension region riser and the second extension region riser might further have the first conductivity level.

At 1025, a first source/drain region and a second source/drain region might be formed. For example, a first source/drain region 570 and a second source/drain region 574 might be formed. The first source/drain region might be formed in the first extension region riser, and the second source/drain region might be formed in the second extension region riser. The first source/drain region and the second source/drain region might have the second conductivity type. The first source/drain region and the second source/drain region might further have conductivity level greater than the first conductivity level.

Figure 11:
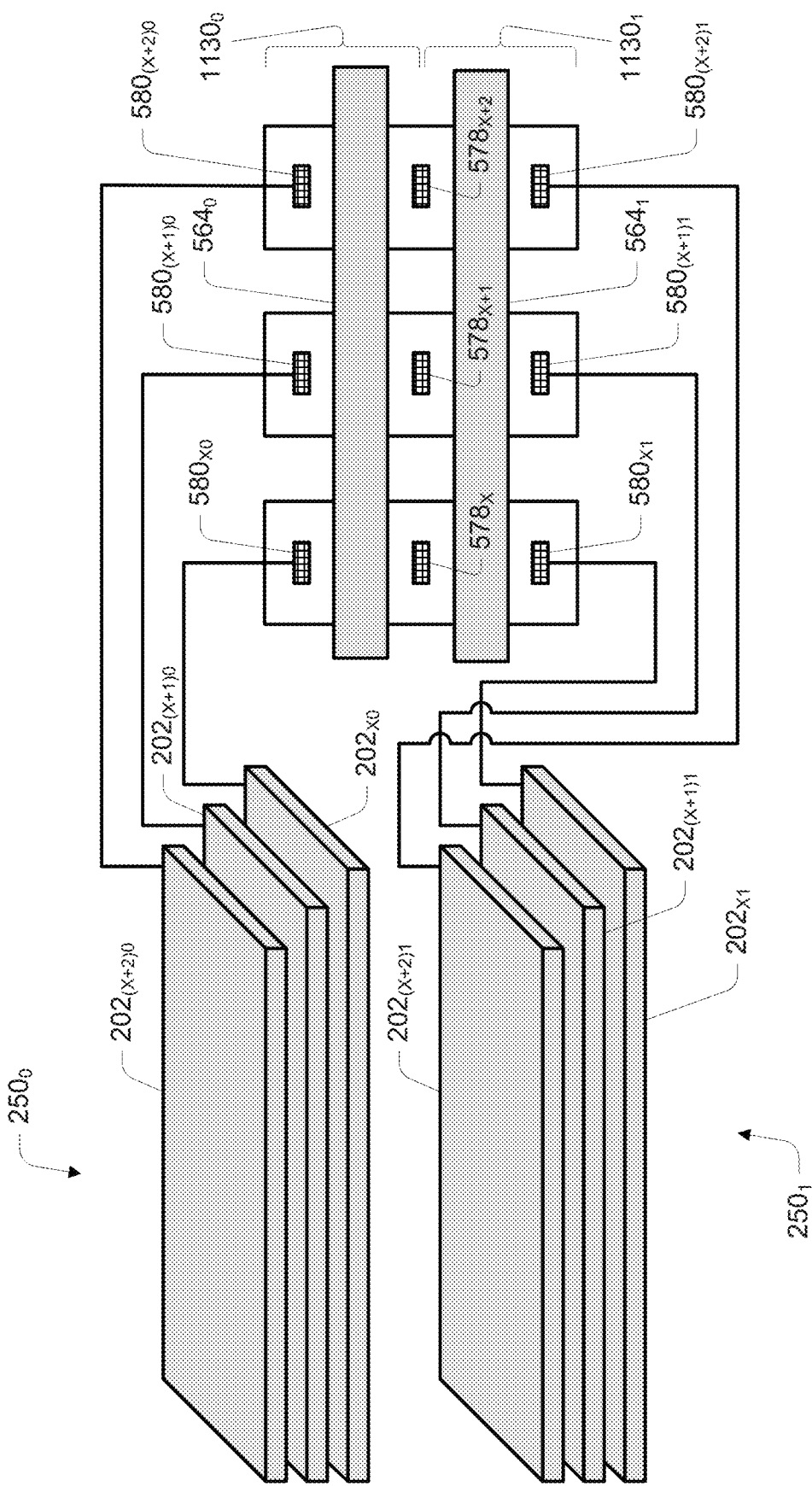
FIG. 11 conceptually depicts connection of a portion of a string driver connected to access lines of multiple blocks of memory cells in accordance with an embodiment.

FIG. 11 conceptually depicts connection of a portion of a string driver circuitry connected to access lines of multiple blocks of memory cells in accordance with an embodiment. For example, a first string driver $1130_0$ might have transistors (not enumerated in FIG. 11) corresponding to conductor $564_0$ and connected between first contacts 578, e.g., first contacts $578_X$, $578_{X+1}$, and $578_{X+2}$, and corresponding second contacts 580, e.g., second contacts $580_{(X)0}$, $580_{(X+1)0}$, and $580_{(X+2)0}$, respectively, and a second string driver $1130_1$ might have transistors (not enumerated in FIG. 11) corresponding to conductor 5641 and connected between first contacts 578, e.g., first contacts $578_X$, $578_{X+1}$, and $578_{X+2}$, and corresponding second contacts 580, e.g., second contacts $580_{(X)1}$, $580_{(X+1)1}$, and $580_{(X+2)1}$, respectively. The transistors of the string drivers $1130_0$ and $1130_1$ might correspond to transistors 554 depicted in FIGS. 5A and 5B, for example.

The second contacts $580_{(X)0}$, $580_{(X+1)0}$, and $580_{(X+2)0}$ of the first string driver $1130_0$ might be connected to access lines $202_{(X)0}$, $202_{(X+1)0}$, and $202_{(X+2)0}$, respectively, of a block of memory cells $250_0$. The access lines $202_{(X)0}$, $202_{(X+1)0}$, and $202_{(X+2)0}$ might represent only a portion of access lines of the block of memory cells $250_0$. For example, the block of memory cells $250_0$ might include N+1 access lines 202 such as depicted in FIG. 2A, and the access lines $202_{(X)0}$, $202_{(X+1)0}$, and $202_{(X+2)0}$ of the block of memory cells $250_0$ might correspond to access lines $202_X$, $202_{X+1}$, and $202_{X+2}$, respectively, of FIG. 2A.

The second contacts $580_{(X)1}$, $580_{(X+1)1}$, and $580_{(X+2)1}$ of the second string driver $1130_1$ might be connected to access lines $202_{(X)1}$, $202_{(X+1)1}$, and $202_{(X+2)1}$, respectively, of a block of memory cells $250_1$. The access lines $202_{(X)1}$, $202_{(X+1)1}$, and $202_{(X+2)1}$ might represent only a portion of access lines of the block of memory cells $250_1$. For example, the block of memory cells $250_1$ might include N+1 access lines 202 such as depicted in FIG. 2A, and the access lines $202_{(X)1}$, $202_{(X+1)1}$, and $202_{(X+2)1}$ of the block of memory cells $250_1$ might correspond to access lines $202_X$, $202_{X+1}$, and $202_{X+2}$, respectively, of FIG. 2A.

The string drivers $1130_0$ and $1130_1$ might be a portion of the peripheral circuitry 226 of FIG. 2C. For example, the string driver $1130_0$ might be formed under (e.g., at least partially under) the access lines $202_{(X)0}$, $202_{(X+1)0}$, and $202_{(X+2)0}$ of the block of memory cells $250_0$. Similarly, the string driver $1130_1$ might be formed under (e.g., at least partially under) the access lines $202_{(X)1}$, $202_{(X+1)1}$, and $202_{(X+2)1}$ of the block of memory cells $250_1$.

The blocks of memory cells $250_0$ and $250_1$ might include more than one sub-block of memory cells. For example, the blocks of memory cells $250_0$ and $250_1$ might have an architecture corresponding to the array of memory cells 200B of FIG. 2B, where the array of memory cells 200B would have K+1 sub-blocks, with each sub-block including those memory cells selectively connected to a corresponding data line 204 in response to one select line 215 of the select lines $215_0$-$215_K$. A pitch between such sub-blocks of memory cells might extend in the direction of the data lines 204. Pitch refers to a distance between repeated elements in a structure possessing translational symmetry. For example, a pitch of the sub-blocks might represent a distance between one edge of a NAND string of memory cells 206 of the sub-block of memory cells corresponding to the select line $215_0$, and a corresponding edge of an adjacent NAND string of memory cells 206 of the sub-block of memory cells corresponding to the select line $215_1$.

Similarly, the string drivers $1130_0$ and $1130_1$ might have a pitch in the same linear direction as the sub-blocks of memory cells. With reference to FIG. 5A, this pitch of the string drivers $1130_0$ and $1130_1$ might correspond to one-half the distance 567, plus the distance 563, plus the distance 565, plus one-half the distance 569. For some embodiments, the pitch of the string drivers $1130_0$ and $1130_1$ might be less than three times the pitch of the sub-blocks of memory cells of the blocks of memory cells $250_0$ and $250_1$, respectively. For further embodiments, the pitch of the string drivers $1130_0$ and $1130_1$ might be less than 2.5 times the pitch of the sub-blocks of memory cells of the blocks of memory cells $250_0$ and $250_1$, respectively.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory, comprising:
   an array of memory cells;
   a plurality of access lines, each access line of the plurality of access lines commonly connected to control gates of a respective plurality of memory cells of the array of memory cells; and
   driver circuitry comprising a plurality of transistors with each transistor of the plurality of transistors having a first source/drain region connected to a respective access line of the plurality of access lines;
   wherein a particular transistor of the plurality of transistors comprises:
      a semiconductor overlying a substrate, wherein the semiconductor comprises a plurality of fins in a channel of the particular transistor and overlying the substrate, and wherein the semiconductor has a first conductivity type;
      a plurality of plugs of a first dielectric, wherein each plug of the plurality of plugs of the first dielectric is formed between a respective pair of fins of the plurality of fins of the semiconductor;
      a second dielectric overlying the semiconductor;
      a conductor overlying the second dielectric and extending between each pair of fins of the plurality of fins of the semiconductor;
      a first extension region base formed in the semiconductor and extending beyond a first edge of the conductor, wherein the first extension region base has a second conductivity type different than the first conductivity type;
      a second extension region base formed in the semiconductor and extending beyond a second edge of the conductor opposite the first edge of the conductor, wherein the second extension region base has the second conductivity type;
      a first extension region riser formed overlying the first extension region base and having the second conductivity type;
      a second extension region riser formed overlying the second extension region base and having the second conductivity type;
      the first source/drain region of the particular transistor formed in the first extension region riser, wherein the first source/drain region of the particular transistor has the second conductivity type and has a conductivity level greater than a conductivity level of the first extension region riser; and
a second source/drain region formed in the second extension region riser and connected to a respective voltage node, wherein the second source/drain region has the second conductivity type and has a conductivity level greater than a conductivity level of the second extension region riser;
wherein each fin of the plurality of fins of the semiconductor is devoid of conductive doping below an upper-most surface of each respective plug of the plurality of plugs of the first dielectric; and
wherein the conductor extends between each pair of fins of the plurality of fins of the semiconductor to a level below a bottom-most surface of the first extension region base and below a bottom-most surface of the second extension region base.

2. The memory of claim 1, wherein the semiconductor comprises a first semiconductor material, and wherein the substrate comprises the first semiconductor material.

3. The memory of claim 1, wherein the array of memory cells is a three-dimensional NAND memory array, and wherein the three-dimensional NAND memory array is formed over the driver circuitry.

4. The memory of claim 3, wherein the three-dimensional NAND memory array comprises a block of memory cells, the block of memory cells comprising:
a first sub-block of memory cells of a plurality of sub-blocks of memory cells comprising a first plurality of strings of series-connected memory cells selectively connected to respective data lines of a plurality of data lines responsive to a first select line; and
a second sub-block of memory cells of the plurality of sub-blocks of memory cells comprising a second plurality of strings of series-connected memory cells selectively connected to respective data lines of the plurality of data lines responsive to a second select line;
wherein a pitch of the driver circuitry in a direction of a data line of the plurality of data lines is less than three times a pitch of a sub-block of memory cells of the plurality of sub-blocks of memory cells in the direction of that data line of the plurality of data lines.

5. The memory of claim 1, wherein each transistor of the plurality of transistors comprises:
a respective instance of the semiconductor overlying the substrate, wherein each respective instance of the semiconductor comprises a respective plurality of fins overlying the substrate, and wherein each respective instance of the semiconductor has the first conductivity type;
a respective plurality of plugs of the first dielectric, wherein each plug of each respective plurality of plugs of the first dielectric is formed between a pair of fins of its respective plurality of fins of its respective instance of the semiconductor;
a respective instance of the second dielectric overlying its respective instance of the semiconductor;
a respective conductor overlying its respective instance of the second dielectric and extending between each pair of fins of its respective plurality of fins of its respective instance of the semiconductor;
a respective first extension region base formed in its respective instance of the semiconductor and extending beyond a first edge of its respective conductor, wherein each respective first extension region base has the second conductivity type;
a respective second extension region base formed in its respective instance of the semiconductor and extending beyond a second edge of its respective conductor opposite the first edge of its respective conductor, wherein each respective second extension region base has the second conductivity type;
a respective first extension region riser formed overlying its respective first extension region base and having the second conductivity type;
a respective second extension region riser formed overlying its respective second extension region base and having the second conductivity type;
its respective first source/drain region formed in its respective first extension region riser, wherein each respective first source/drain region has the second conductivity type and has a conductivity level greater than a conductivity level of its respective first extension region riser; and
a respective second source/drain region formed in its respective second extension region riser and connected to a respective voltage node, wherein each respective second source/drain region has the second conductivity type and has a conductivity level greater than a conductivity level of its respective second extension region riser.

6. The memory of claim 5, wherein the respective conductors of each transistor of the plurality of transistors are commonly connected.

7. The memory of claim 1, wherein a portion of the first extension region base of the particular transistor further extends beneath a first portion of the conductor, and wherein a portion of the second extension region base of the particular transistor further extends beneath a second portion of the conductor.

8. The memory of claim 1, wherein the first extension region riser and the first extension region base of the particular transistor each comprise a same semiconductor material.

9. The memory of claim 1, wherein the first extension region riser and the first extension region base of the particular transistor each have a single crystal lattice.

10. The memory of claim 1, wherein the plurality of access lines is a plurality of local access lines, and wherein the second source/drain region of the particular transistor is connected to a global access line as its respective voltage node, wherein the global access line is selectively connected to a local access line of the plurality of local access lines and selectively connected to a local access line of a different plurality of local access lines of the memory.

11. The memory of claim 1, wherein the first extension region base of the particular transistor extends away from the first edge of the conductor to an edge of an isolation region formed adjacent the semiconductor.

12. The memory of claim 1, wherein the conductivity level of the first source/drain region is at least an order of magnitude greater than the conductivity level of the first extension region riser of the particular transistor.

13. The memory of claim 12, wherein the conductivity level of first extension region riser of the particular transistor and a conductivity level of first extension region base are a same conductivity level.

14. The memory of claim 1, wherein the driver circuitry is first driver circuitry, the plurality of access lines is a first plurality of access lines, the plurality of transistors is a first plurality of transistors, the second dielectric material is a first instance of the second dielectric material, and the conductor is a first conductor, the memory further comprising:
  a second plurality of access lines, each access line of the second plurality of access lines commonly connected to control gates of a respective plurality of memory cells of the array of memory cells; and
  second driver circuitry comprising a second plurality of transistors with each transistor of the second plurality of transistors having a first source/drain region connected to a respective access line of the second plurality of access lines;
  wherein a particular transistor of the second plurality of transistors comprises:
    a second instance of the second dielectric overlying the semiconductor;
    a second conductor overlying the second instance of the second dielectric and extending between each pair of fins of the plurality of fins of the semiconductor;
    a third extension region base formed in the semiconductor and extending beyond a first edge of the second conductor, wherein the third extension region base has the second conductivity type;
    a third extension region riser formed overlying the third extension region base and having the second conductivity type; and
    the first source/drain region of the particular transistor of the second plurality of transistors formed in the third extension region riser, wherein the first source/drain region of the particular transistor of the second plurality of transistors has the second conductivity type and has a conductivity level greater than a conductivity level of the third extension region riser;
    wherein a second source/drain region of the particular transistor of the second plurality of transistors is the second source/drain region of the particular transistor of the first plurality of transistors; and
    wherein the second conductor extends between each pair of fins of the plurality of fins of the semiconductor to a level below a bottom-most surface of the second extension region base and below a bottom-most surface of the third extension region base.

15. The memory of claim 1, wherein each fin of the plurality of fins of the semiconductor comprises a respective first end and a respective second end opposite its respective first end, and wherein the semiconductor further comprises a first portion bridging a gap between the respective first ends of a particular pair of adjacent fins of the plurality of fins, and a second portion bridging a gap between the respective second ends of the particular pair of adjacent fins of the plurality of fins.

16. The memory of claim 15, wherein, for each pair of adjacent fins of the plurality of fins of the semiconductor, the semiconductor further comprises a respective first portion bridging a gap between the respective first ends of that pair of adjacent fins of the plurality of fins, and a respective second portion bridging a gap between the respective second ends of that pair of adjacent fins of the plurality of fins.

17. A memory, comprising:
  an array of memory cells;
  a plurality of global access lines;
  a plurality of local access lines, each access line of the plurality of local access lines commonly connected to control gates of a respective plurality of memory cells of the array of memory cells; and
  driver circuitry comprising a plurality of transistors with each transistor of the plurality of transistors having a respective first source/drain region connected to a respective local access line of the plurality of local access lines and a respective second source/drain region connected to a respective global access line of the plurality of global access lines;
  wherein a particular transistor of the plurality of transistors comprises:
    a semiconductor overlying a substrate, wherein the semiconductor comprises a plurality of fins overlying the substrate, and wherein the semiconductor has a first conductivity type;
    a plurality of plugs of a first dielectric, wherein each plug of the plurality of plugs of the first dielectric is formed between a pair of fins of the plurality of fins of the semiconductor;
    a second dielectric overlying the semiconductor;
    a conductor overlying the second dielectric and extending between each pair of fins of the plurality of fins of the semiconductor;
    a first extension region base formed in the semiconductor and extending beyond a first edge of the conductor, wherein the first extension region base has a second conductivity type different than the first conductivity type;
    a second extension region base formed in the semiconductor and extending beyond a second edge of the conductor, opposite the first edge of the conductor, wherein the second extension region base has the second conductivity type;
    a first extension region riser formed overlying the first extension region base and having the second conductivity type;
    a second extension region riser formed overlying the second extension region base and having the second conductivity type;
    the first source/drain region of the particular transistor formed in the first extension region riser, wherein the first source/drain region of the particular transistor has the second conductivity type and has a conductivity level greater than a conductivity level of the first extension region riser; and
    the second source/drain region of the particular transistor formed in the second extension region riser, wherein the second source/drain region of the particular transistor has the second conductivity type and has a conductivity level greater than a conductivity level of the second extension region riser;
    wherein the conductor extends between each pair of fins of the plurality of fins of the semiconductor to a level below a bottom-most surface of the first extension region base and below a bottom-most surface of the second extension region base.

18. The memory of claim 17, wherein the array of memory cells is a three-dimensional NAND memory array, and wherein the three-dimensional NAND memory array is formed over the driver circuitry.

19. The memory of claim 17, wherein the first extension region base of the particular transistor further extends beneath the conductor, and wherein the second extension region base of the particular transistor further extends beneath the conductor.

20. The memory of claim 17, wherein the first extension region riser and the first extension region base of the particular transistor each comprise a same semiconductor material.

21. The memory of claim 17, wherein the first extension region riser and the first extension region base of the particular transistor each have a single crystal lattice.

22. The memory of claim 17, wherein the first extension region base of the particular transistor extends away from the first edge of the conductor to an edge of an isolation region formed adjacent the semiconductor.

23. The memory of claim 17, wherein the conductivity level of the first source/drain region is at least an order of magnitude greater than the conductivity level of the first extension region riser of the particular transistor.

24. The memory of claim 23, wherein the conductivity level of first extension region riser of the particular transistor and a conductivity level of first extension region base are a same conductivity level.

25. The memory of claim 17, wherein the respective conductors of each transistor of the plurality of transistors are commonly connected.

26. A memory, comprising:
an array of memory cells comprising a plurality of blocks of memory cells;
a plurality of global access lines;
a first plurality of local access lines, each access line of the first plurality of local access lines commonly connected to control gates of a respective plurality of memory cells of a first block of memory cells of the array of memory cells;
a second plurality of local access lines, each access line of the second plurality of local access lines commonly connected to control gates of a respective plurality of memory cells of a second block of memory cells of the array of memory cells; and
driver circuitry comprising a first plurality of transistors with each transistor of the first plurality of transistors having a respective first source/drain region connected to a respective local access line of the first plurality of local access lines and a respective second source/drain region connected to a respective global access line of the plurality of global access lines, and comprising a second plurality of transistors with each transistor of the second plurality of transistors having a respective first source/drain region connected to a respective local access line of the second plurality of local access lines and a respective second source/drain region connected to a respective global access line of the plurality of global access lines;
wherein each transistor of the first plurality of transistors and of the second plurality of transistors comprises:
a respective instance of a semiconductor overlying a substrate, wherein each respective instance of the semiconductor comprises a respective plurality of fins overlying the substrate, and wherein each respective instance of the semiconductor has a first conductivity type;
a respective plurality of plugs of a first dielectric, wherein each plug of each respective plurality of plugs of the first dielectric is formed between a pair of fins of its respective plurality of fins of its respective instance of the semiconductor;
a respective instance of a second dielectric overlying its respective instance of the semiconductor;
a respective conductor overlying its respective instance of the second dielectric and extending between each pair of fins of the respective plurality of fins of its respective instance of the semiconductor;
a respective first extension region base formed in its respective instance of the semiconductor and extending beyond a first edge of its respective conductor, wherein each respective first extension region base has the second conductivity type;
a respective second extension region base formed in its respective instance of the semiconductor and extending beyond a second edge of its respective conductor opposite the first edge of its respective conductor, wherein each respective second extension region base has the second conductivity type;
a respective first extension region riser formed overlying its respective first extension region base and having the second conductivity type;
a respective second extension region riser formed overlying its respective second extension region base and having the second conductivity type;
its respective first source/drain region formed in its respective first extension region riser, wherein each respective first source/drain region has the second conductivity type and has a conductivity level greater than a conductivity level of its respective first extension region riser; and
its respective second source/drain region formed in its respective second extension region riser, wherein each respective second source/drain region has the second conductivity type and has a conductivity level greater than a conductivity level of its respective second extension region riser;
wherein each fin of the respective plurality of fins of its respective instance of the semiconductor is devoid of conductive doping in a portion of each fin of the respective plurality of fins of its respective instance of the semiconductor extending both above and below an upper-most surface of each plug of its respective plurality of plugs of the first dielectric; and
wherein its respective conductor extends between each pair of fins of the respective plurality of fins of its respective instance of the semiconductor to a level below a bottom-most surface of its respective first extension region base and below a bottom-most surface of its respective second extension region base.

27. The memory of claim 26, wherein each transistor of the first plurality of transistors corresponds to a respective transistor of the second plurality of transistors, and wherein the respective plurality of fins of the respective instance of the semiconductor of each transistor of the first plurality of transistors is continuous with the respective plurality of fins of the respective instance of the semiconductor of its corresponding transistor of the second plurality of transistors.

28. The memory of claim 27, wherein the respective second extension region base, the respective second extension region riser, and the respective second source/drain region of each transistor of the first plurality of transistors is the respective second extension region base, the respective second extension region riser, and the respective second source/drain region, respectively, of its corresponding transistor of the second plurality of transistors.

29. The memory of claim 26, wherein the array of memory cells is a three-dimensional NAND memory array, and wherein the three-dimensional NAND memory array is formed over the driver circuitry.

30. The memory of claim 26, wherein the respective first extension region base of each transistor of the first plurality of transistors and of the second plurality of transistors further extends beneath its respective conductor, and wherein the second extension region base of each transistor of the first plurality of transistors and of the second plurality of transistors further extends beneath its respective conductor.

31. The memory of claim 26, wherein the respective first extension region riser and the respective first extension region base of each transistor of the first plurality of transistors and of the second plurality of transistors each have a single crystal lattice.

32. The memory of claim 26, wherein the conductivity level of the first source/drain region is at least an order of magnitude greater than the conductivity level of the first extension region riser of the particular transistor.

33. The memory of claim 32, wherein the conductivity level of first extension region riser of the particular transistor and a conductivity level of first extension region base are a same conductivity level.

34. The memory of claim 26, wherein the respective conductors of each transistor of the first plurality of transistors are commonly connected, wherein the respective conductors of each transistor of the second plurality of transistors are commonly connected, and wherein the respective conductors of each transistor of the first plurality of transistors are different than the respective conductors of each transistor of the second plurality of transistors.

\* \* \* \* \*